(12) United States Patent
Liaw

(10) Patent No.: US 9,935,001 B2
(45) Date of Patent: Apr. 3, 2018

(54) METHODS OF FORMING AN INTEGRATED CIRCUIT CHIP HAVING TWO TYPES OF MEMORY CELLS

(71) Applicant: Taiwan Semiconductor Manufacturing Company, Ltd., Hsin-Chu (TW)

(72) Inventor: Jhon Jhy Liaw, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/380,936

(22) Filed: Dec. 15, 2016

(65) Prior Publication Data

US 2017/0098573 A1 Apr. 6, 2017

Related U.S. Application Data

(62) Division of application No. 14/792,865, filed on Jul. 7, 2015, now Pat. No. 9,576,644.

(Continued)

(51) Int. Cl.
*H01L 21/8238* (2006.01)
*H01L 21/768* (2006.01)
*G11C 11/419* (2006.01)
*H01L 27/11* (2006.01)
*G11C 5/06* (2006.01)

(Continued)

(52) U.S. Cl.
CPC ........ *H01L 21/76816* (2013.01); *G11C 5/063* (2013.01); *G11C 11/419* (2013.01); *H01L 21/823821* (2013.01); *H01L 21/823871* (2013.01); *H01L 23/528* (2013.01); *H01L 23/5226* (2013.01); *H01L 23/53209* (2013.01); *H01L 23/53228* (2013.01); *H01L 23/53257* (2013.01); *H01L 27/0924* (2013.01); *H01L 27/1104* (2013.01); *H01L 27/1116* (2013.01)

(58) Field of Classification Search
USPC ....... 365/154, 72, 156, 63; 257/401, E27.06; 438/199, 455
See application file for complete search history.

(56) References Cited

U.S. PATENT DOCUMENTS 5,489,860 A   2/1996   Kitagawa et al.
8,421,205 B2  4/2013   Yang
(Continued)

FOREIGN PATENT DOCUMENTS

TW   201312574 A1   3/2013
TW   201432677 A    8/2014
WO   2009059906 A1  5/2009

*Primary Examiner* — Vu Le
(74) *Attorney, Agent, or Firm* — Slater Matsil, LLP

(57) ABSTRACT

An integrated circuit chip includes a first type memory cell and a second type memory cell. The first type memory cell includes a first reference line landing pad and a first word line landing pad. The first reference line landing pad of the first type memory cell and the first word line landing pad of the first type memory cell are aligned along a first direction. The second type memory cell includes a first reference line segment extending along the first direction and a first word line landing pad. The first word line landing pad of the second type memory cell and the first reference line segment of the second type memory cell are spaced apart along a second direction different from the first direction.

20 Claims, 16 Drawing Sheets

Related U.S. Application Data

(60) Provisional application No. 62/153,053, filed on Apr. 27, 2015.

(51) Int. Cl.
    *H01L 23/528* (2006.01)
    *H01L 23/532* (2006.01)
    *H01L 23/522* (2006.01)
    *H01L 27/092* (2006.01)

(56) References Cited

U.S. PATENT DOCUMENTS

| | | |
|---|---|---|
| 8,661,389 B2 | 2/2014 | Chern et al. |
| 8,693,235 B2 | 4/2014 | Liaw |
| 8,698,205 B2 | 4/2014 | Tzeng et al. |
| 8,826,212 B2 | 9/2014 | Yeh et al. |
| 8,836,141 B2 | 9/2014 | Chi et al. |
| 2002/0001251 A1 | 1/2002 | Fujin et al. |
| 2006/0171194 A1 | 8/2006 | Lowrey et al. |
| 2008/0253171 A1 | 10/2008 | Terada et al. |
| 2012/0235240 A1* | 9/2012 | Dixit .............. H01L 21/845 257/351 |
| 2012/0273899 A1* | 11/2012 | Wann ............ G06F 17/5068 257/401 |
| 2012/0294100 A1 | 11/2012 | Ling et al. |
| 2013/0181297 A1 | 7/2013 | Liaw |
| 2013/0235640 A1 | 9/2013 | Liaw |
| 2014/0054716 A1 | 2/2014 | Chen et al. |
| 2014/0215420 A1 | 7/2014 | Lin et al. |
| 2014/0264924 A1 | 9/2014 | Yu et al. |
| 2014/0282289 A1 | 9/2014 | Hsu et al. |
| 2014/0325466 A1 | 10/2014 | Ke et al. |

* cited by examiner

METHODS OF FORMING AN INTEGRATED CIRCUIT CHIP HAVING TWO TYPES OF MEMORY CELLS

PRIORITY CLAIM AND CROSS-REFERENCE

This application is a divisional of U.S. patent application Ser. No. 14/792,865, filed on Jul. 7, 2015, and entitled "Integrated Circuit Chip Having Two Types of Memory Cells" which claims priority to U.S. Provisional Patent Application No. 61/153,053 filed Apr. 27, 2015, and entitled "SRAM Chip Manufacturing and Cell Structure," which applications are incorporated herein by reference.

The instant application is related to U.S. Patent Application titled "Methods and Apparatus for finFET SRAM Arrays in Integrated Circuits," filed on Dec. 6, 2011, U.S. application Ser. No. 13/312,810, now U.S. Pat. No. 8,693,235. The entire contents of the above-referenced application are incorporated by reference herein.

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. In some applications in an IC chip, a plurality of SRAM devices are implemented based on different design criteria. For example, at least one SRAM device of the plurality of SRAM devices is designed to have faster data access than all other SRAM device(s) of the plurality of SRAM devices; and at least one SRAM device of the plurality of SRAM devices is designed to occupy less area per stored bit than all other SRAM device(s) of the plurality of SRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
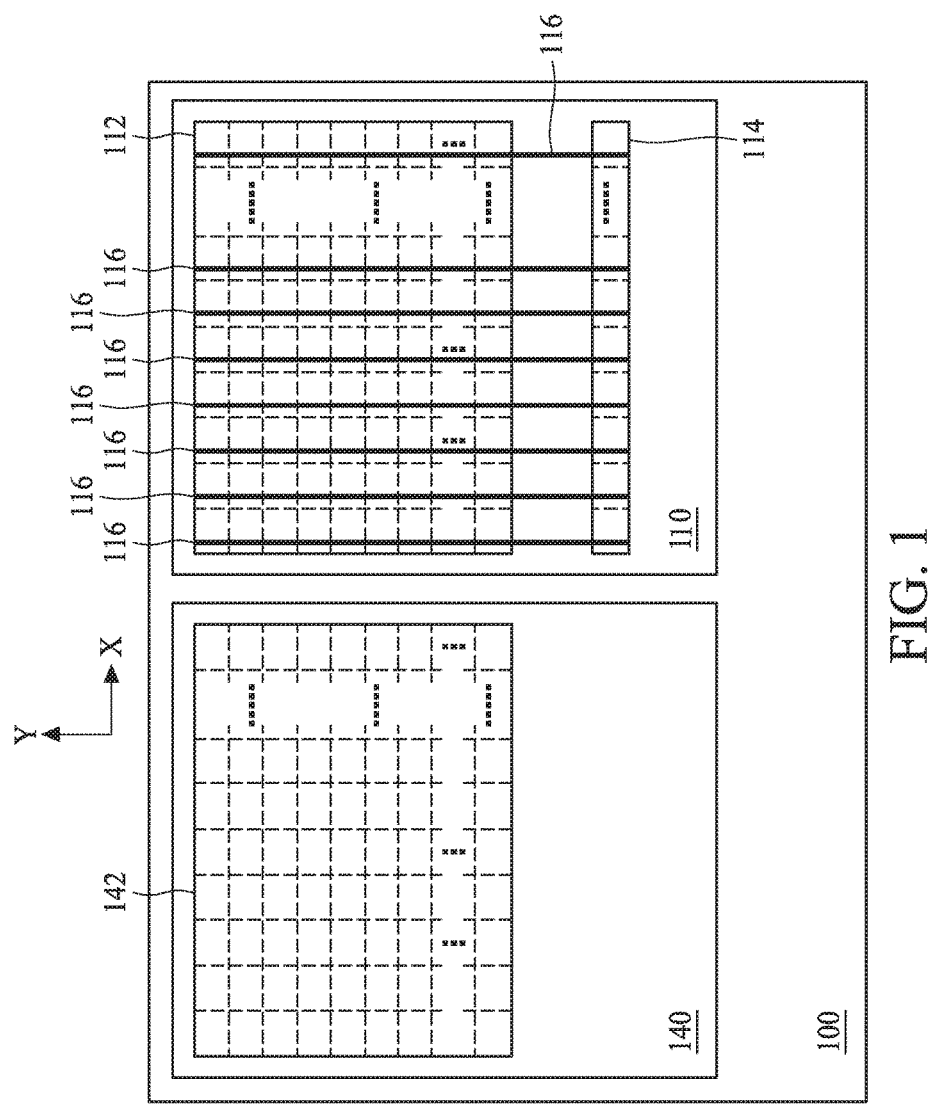
FIG. 1 is a block diagram of an integrated circuit (IC) chip having two static random access memory (SRAM) devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit chip includes a first type memory cell and a second type memory cell. The first type memory cell includes a first reference line landing pad and a first word line landing pad.

The first reference line landing pad of the first type memory cell and the first word line landing pad of the first type memory cell are aligned along a first direction. The second type memory cell includes a first reference line segment extending along the first direction and a first word line landing pad. The first word line landing pad of the second type memory cell and the first reference line segment of the second type memory cell are spaced apart along a second direction different from the first direction.

FIG. 1 is a block diagram of an IC chip 100 having two memory devices 110 and 140, in accordance with some embodiments. Other devices and components of IC chip 100 are not depicted in FIG. 1. Memory devices 110 and 140 are SRAM devices formed of SRAM memory cells. For clarity, some details of memory devices 110 and 140 are not depicted in FIG. 1.

Memory device 110 includes a memory cell array 112, a plurality of write assist circuits 114, and a plurality of conductive lines 116 electrically coupling memory cell array 112 with the plurality of write assist circuits 114. Memory cell array 112 includes a plurality of first type memory cells arranged into rows along a direction X and columns along a direction Y. Each column of the columns of first type memory cells of memory cell array 112 has at least one conductive line of the plurality of conductive lines 116 extending along direction Y and electrically coupling the column and a corresponding write assist circuit of write assist circuits 114.

In some embodiments, the plurality of conductive lines 116 are bit lines of memory device 110, and each write assist circuit of the plurality of write assist circuits 114 is configured to set a voltage level of the corresponding bit line of memory device 110 to be less than a ground reference level. In some embodiments, the plurality of conductive lines 116 are bit lines of memory device 110, and each write assist circuit of the plurality of write assist circuits 114 are supply voltage lines of memory device 110, and each write assist circuit of the plurality of write assist circuits 114 is configured to set a voltage level of the corresponding supply voltage line of memory device 110 to be less than a supply voltage level.

Memory device 140 includes a memory cell array 142. Memory cell array 142 includes a plurality of second type memory cells arranged into rows along direction X and columns along direction Y. Memory device 140 is free from having a counterpart circuit of the write assist circuit 114 of memory device 110.

In some embodiments, a first type memory cell used to implement memory device 110 occupies an area less than that of a second type memory cell used to implement memory device 140. In some embodiments, a pass gate device of the second type memory cell used to implement memory device 140 has a driving capability greater than that of a pass gate device of the first type memory cell used to implement memory device 110. In some embodiments in a single chip, the first type memory cell is referred to as a smaller memory cell, and the second type memory cell is referred to as a faster memory cell.

Further details regarding the first type memory cell are described in conjunction with FIGS. 2, 3, 5, and 7. Further details regarding the second type memory cell are described in conjunction with FIGS. 2, 4, and 6.

Figure 2:
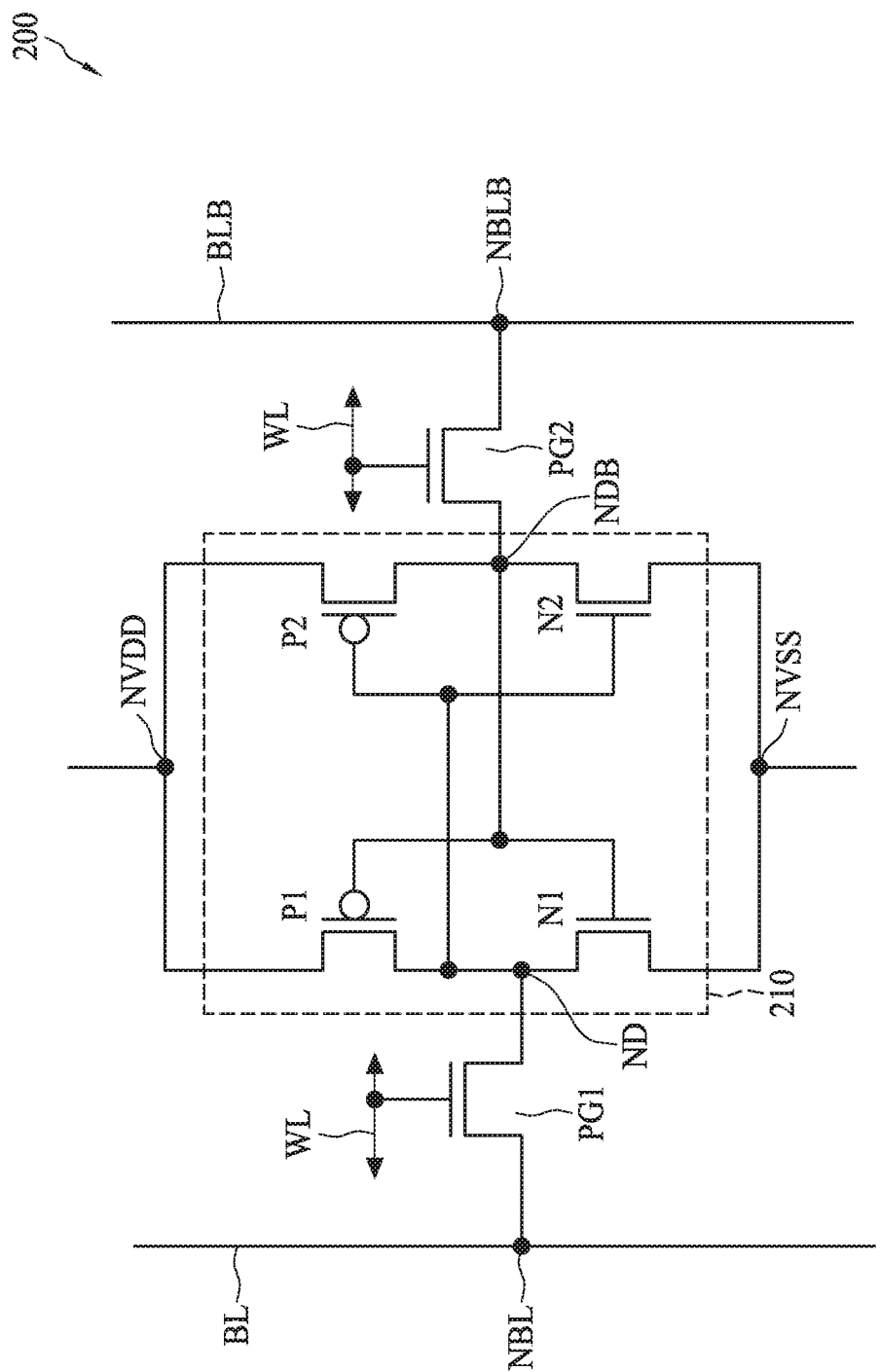
FIG. 2 is a schematic circuit diagram of a memory cell, in accordance with some embodiments.

FIG. 2 is a schematic circuit diagram of a memory cell 200, in accordance with some embodiments. In some embodiments, memory cell 200 corresponds to the first type memory cell or the second type memory cell in FIG. 1.

Memory cell 200 includes a storage circuit 210 having data nodes ND and NDB, two pass gate devices PG1 and PG2, a supply voltage node NVDD, a reference voltage node NVSS, a first bit line BL, a second bit line BLB, and a word line WL. Storage circuit 210 is electrically coupled between supply voltage node NVDD and reference voltage node NVSS. Pass gate device PG1 is electrically coupled with data node ND, bit line BL, and word line WL. Pass gate device PG2 is electrically coupled with data node NDB, bit line BLB, and word line WL.

Storage circuit 210 includes two P-type metal oxide semiconductor (PMOS) transistors P1 and P2 and two N-type metal oxide semiconductor (NMOS) transistors N1 and N2. Transistors P1, P2, N1, and N2 form a cross latch having two cross-coupled inverters. Transistors P1 and N1 form a first inverter while transistors P2 and N2 form a second inverter. Drains of transistors P1 and N1 are coupled together and form data node ND. Drains of transistors P2 and N2 are coupled together and form data node NDB. Gates of transistors P1 and N1 are coupled together and to drains of transistors P2 and N2. Gates of transistors P2 and N2 are coupled together and to drains of transistors P1 and N1. Sources of transistor P1 and P2 are coupled with supply voltage node. In some embodiments, supply voltage node NVDD is configured to receive a supply voltage VDD. Sources of transistors N1 and N2 are coupled with reference voltage node. In some embodiments, reference voltage node NVSS is configured to receive a ground reference voltage VSS.

Pass gate devices PG1 and PG2 are N-type transistors. A drain of pass gate device PG1 is electrically coupled with bit line BL at node NBL. A source of pass gate device PG1 is electrically coupled with data node ND. A drain of pass gate device PG2 is electrically coupled with bit line BLB at node NBLB. A source of pass gate device PG2 is electrically coupled with data node NDB. A gate of pass gate device PG1 and a gate of pass gate device PG2 are electrically coupled with a word line WL. Gates of pass gate devices PG1 and PG2 are control terminals thereof configured to receive a control signal for turning on or off pass gate devices PG 1 and PG2.

In some embodiments, in a memory array, such as memory cell array 112 or memory cell array 142, having a plurality of memory cells each having a circuit schematic illustration the same as memory cell 200, bit lines BL and BLB are coupled to each drain of pass gate devices PG1 and PG2 of memory cells in a column of the memory array, and word line WL is coupled to each gate of pass gate devices PG1 and PG2 of memory cells in a row of the memory array.

Memory cell 200 is a single port SRAM cell illustrated as an example. In some embodiments, the present application is applicable to a multiple-port SRAM cell having one or more write ports and/or one or more read ports.

Figure 3:
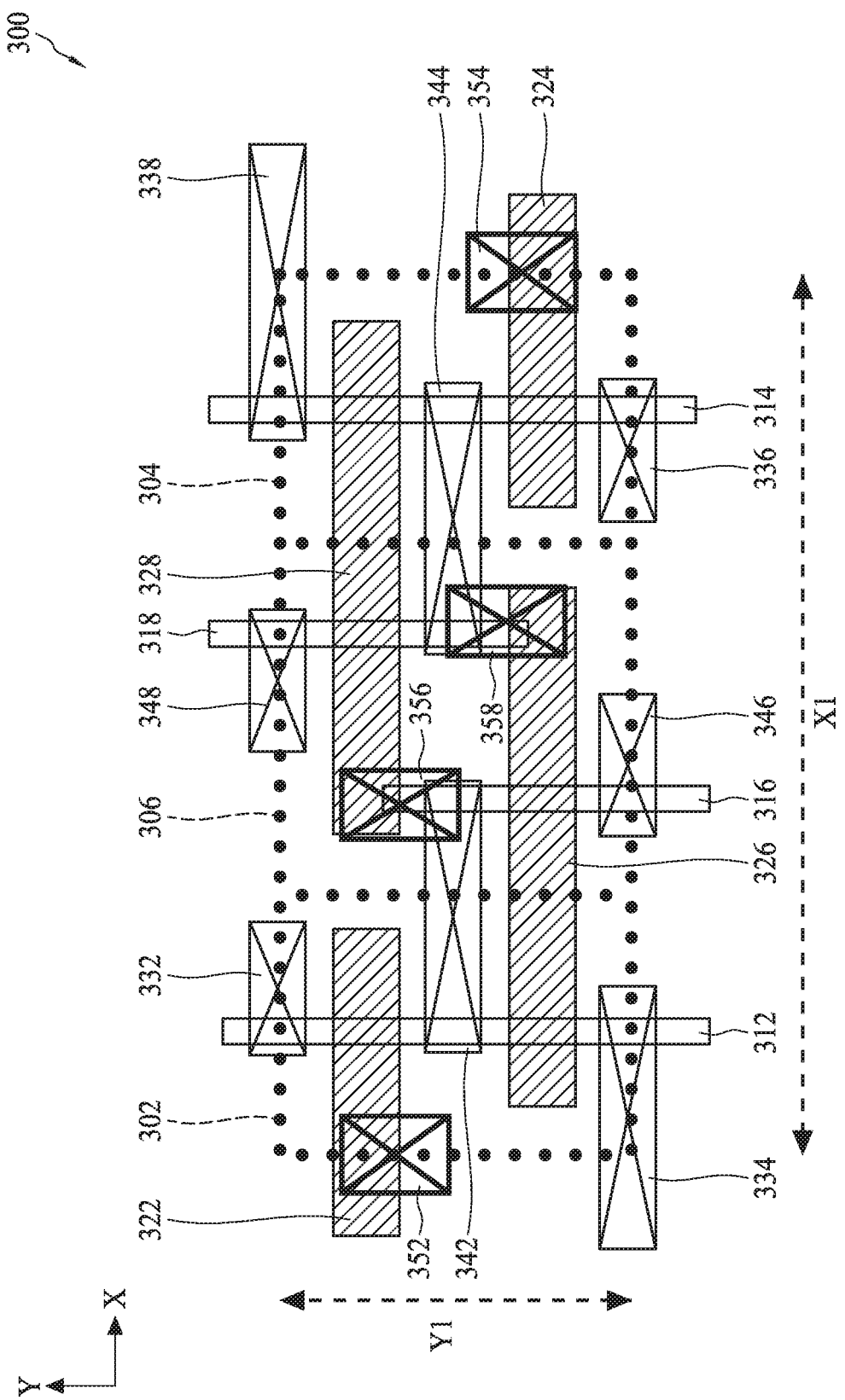
FIG. 3 is a top view of a first type memory cell, with all the depictions regarding components at and over a first metal layer of a chip omitted, in accordance with some embodiments.

FIG. 3 is a top view of a first type memory cell 300, with all the depictions regarding components at and over a first metal layer of a chip omitted, in accordance with some embodiments. Moreover, the depictions regarding via plugs connecting various components depicted in FIG. 3 and the first metal layer are omitted. The first metal layer of the chip will be further illustrated in conjunction with FIG. 8. In some embodiments, first type memory cell 300 is an implementation of a first type memory cell in FIG. 1 having a circuit schematic illustration as memory cell 200 depicted in FIG. 2. Some components of first type memory cell 300 are not shown in FIG. 3 for clarity of FIG. 3.

Memory cell 300 includes a substrate (not labeled) having P-well regions 302 and 304 and an N-well region 306.

Memory cell 300 includes a plurality of active structures 312, 314, 316, and 318 extending along a direction Y; a plurality of gate structures 322, 324, 326, and 328 extending along a direction X; a plurality of active contact structures 332, 334, 336, 338, 342, 344, 346, and 348; and a plurality of gate contact structures 352, 354, 356, and 358.

Active structures 312 and 314 are in P-well regions 302 and 304 for forming NMOS transistors. Active structures 316 and 318 are in N-well region 306 forming PMOS transistors. Active structures 312, 314, 316, and 318 are semiconductor fins formed on the substrate. The number of fins for each transistor depicted in FIG. 3 is provided as an example. In some embodiments, any number of fins is within the scope of various embodiments. In some embodiments, active structures 312, 314, 316, and 318 are integrally formed with the substrate.

Gate structure 326 overlaps active structure 316 and functions as a gate of transistor P1. Active contact structures 346 and 342 overlap active structure 316 and correspond to a source and a drain of transistor P1. Gate structure 328 overlaps active structure 318 and functions as a gate of transistor P2. Active contact structures 348 and 344 overlap active structure 318 and correspond to a source and a drain of transistor P2. Gate contact structure 356 connects gate structure 328 and active contact structures 342. Gate contact structure 358 connects gate structure 326 and active contact structures 344. Gate structure 326 also overlaps active structure 312 and functions as a gate of transistor N1. Active contact structures 334 and 342 overlap active structure 312 and correspond to a source and a drain of transistor N1. Gate structure 328 overlaps active structure 314 and functions as a gate of transistor N2. Active contact structures 338 and 336 overlap active structure 314 and correspond to a source and a drain of transistor N2.

Accordingly, active contact structures 346 and 348 correspond to node NVDD; and active contact structures 334 and 338 correspond to node NVSS.

Gate structure 322 overlaps active structure 312 and functions as a gate of pass gate device PG1. Active contact structures 332 and 342 overlap active structure 312 and correspond to a source and a drain of pass gate device PG1. Gate contact structure 352 contacts gate structure 322 and functions as a landing pad for gate structure 322. Gate structure 324 overlaps active structure 314 and functions as a gate of pass gate device PG2. Active contact structures 336 and 344 overlap active structure 314 and correspond to a source and a drain of pass gate device PG2. Gate contact structure 354 contacts gate structure 324 and functions as a landing pad for gate structure 324.

Accordingly, active contact structure 332 corresponds to node NBL; and active contact structure 336 corresponds to node NBLB.

Memory cell 300 has a cell width X1 measurable along direction X and a cell height Y1 measurable along direction Y. In some applications, a memory macro is formed by repeating and abutting memory cells having a configuration identical or mirrored-identical to memory cell 300, and thus cell width X1 is also referred to as a cell pitch along direction X, and cell height Y1 is also referred to as a cell pitch along direction Y. In some embodiments, a ratio of cell width X1 to cell height Y1 is greater than one.

Figure 4:
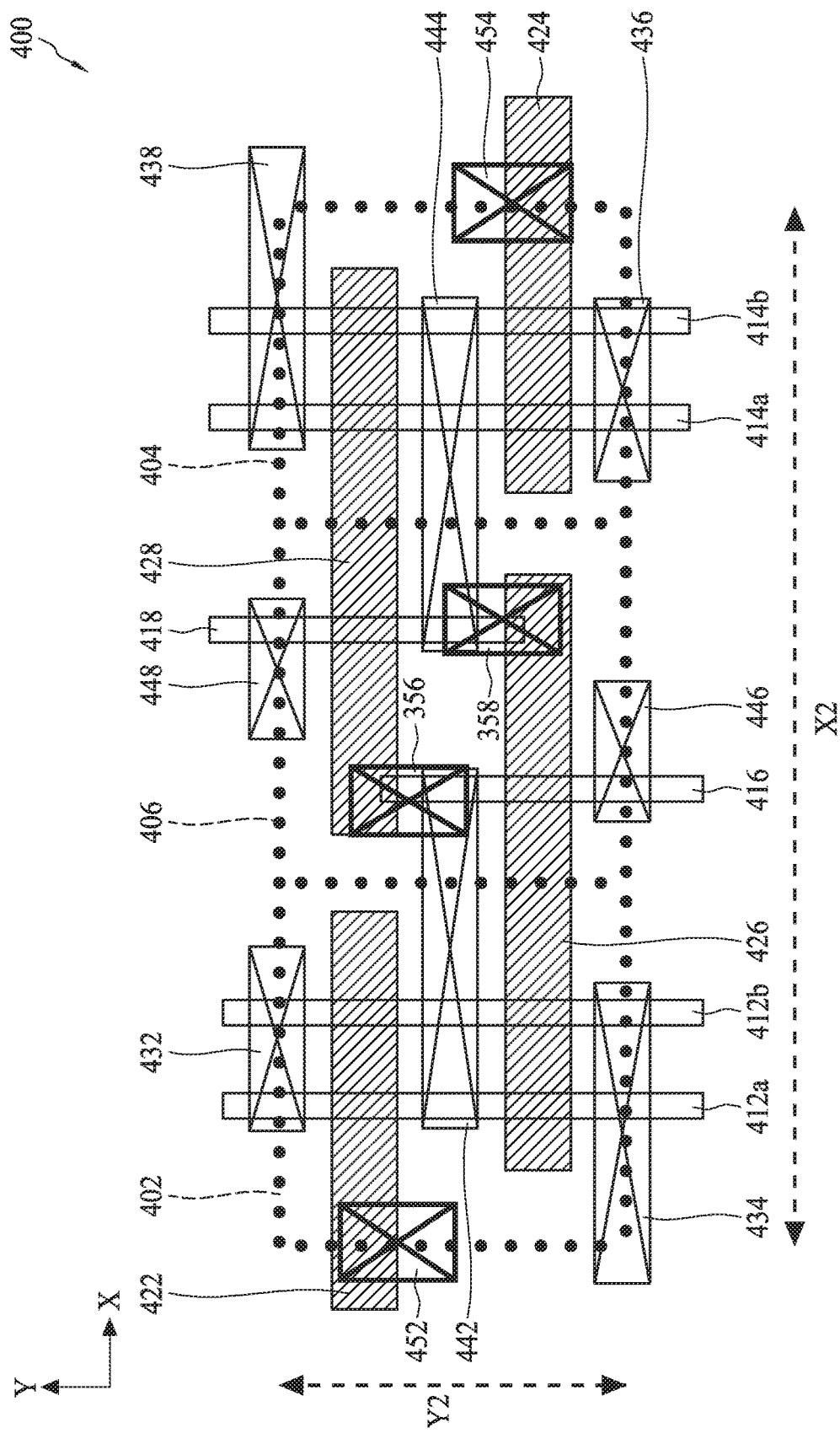
FIG. 4 is a top view of a second type memory cell, with all the depictions regarding components at and over the first metal layer of the chip omitted, in accordance with some embodiments.

FIG. 4 is a top view of a second type memory cell 400, with all the depictions regarding components at and over the first metal layer of the chip omitted, in accordance with some embodiments. Moreover, the depictions regarding via plugs connecting various components depicted in FIG. 4 and the first metal layer are omitted. In some embodiments, second type memory cell 400 is an implementation of a second type memory cell in FIG. 1 having a circuit schematic illustration as memory cell 200 depicted in FIG. 2. Some components of first type memory cell 400 are not shown in FIG. 4 for clarity of FIG. 4.

Memory cell 400 includes a substrate (not labeled) having P-well regions 402 and 404 and an N-well region 406. Memory cell 400 includes a plurality of active structures 412a, 412b, 414a, 414b, 416, and 418 extending along direction Y; a plurality of gate structures 422, 424, 426, and 428 extending along a direction X; a plurality of active contact structures 432, 434, 436, 438, 442, 444, 446, and 448; and a plurality of gate contact structures 452, 454, 456, and 458. Except active structures 412a, 412b, 414a, and 414b, each component depicted in FIG. 4 and a counterpart component depicted in FIG. 3 that have the same last two-digit reference number correspond to each other, and detailed description thereof is thus omitted.

Compared with first type memory cell 300, second type memory cell 400 replaces active structure 312 with active structures 412a and 412b and replaces active structure 314 with active structures 414a and 414b.

Gate structure 422 overlaps active structures 412a and 412b and functions as a gate of pass gate device PG1. Active contact structures 432 and 442 overlap active structures 412a and 412b and correspond to a source and a drain of pass gate device PG1. Gate structure 422, active structures 412a and 412b, and active contact structures 432 and 442 are configured as two transistors connected in parallel. In some embodiments, pass gate device PG1 of second type memory cell 400 is configured to have a driving capability greater than that of pass gate device PG1 of first type memory cell 300. In some embodiments, the driving capability of pass gate device PG 1 of second type memory cell 400 is about twice the driving capability of pass gate device PG1 of first type memory cell 300.

Gate contact structure 452 contacts gate structure 422 and functions as a landing pad for gate structure 422. Gate structure 424 overlaps active structures 414a and 414b and functions as a gate of pass gate device PG2. Active contact structures 436 and 444 overlap active structures 414a and 414b and correspond to a source and a drain of pass gate device PG2. Gate contact structure 454 contacts gate structure 424 and functions as a landing pad for gate structure 424. In some embodiments, pass gate device PG2 of second type memory cell 400 is configured to have a driving capability greater than that of pass gate device PG2 of first type memory cell 300 in a manner similar to pass gate device PG1. In some embodiments, the driving capability of pass gate device PG2 of second type memory cell 400 is about twice the driving capability of pass gate device PG2 of first type memory cell 300.

Gate structure 426 also overlaps active structures 412a and 412b and functions as a gate of transistor N1. Active contact structures 434 and 442 overlap active structures 412a and 412b and correspond to a source and a drain of transistor N1. Gate structure 428 overlaps active structures 414a and 414b and functions as a gate of transistor N2. Active contact structures 438 and 436 overlap active structures 414a and 414b and correspond to a source and a drain of transistor N2. In some embodiments, transistor N1 of second type memory cell 400 is configured to have a driving capability greater than that of transistor N1 of first type memory cell 300. In some embodiments, transistor N2 of second type memory cell 400 is configured to have a driving capability greater than that of transistor N2 of first type memory cell 300.

Memory cell 400 has a cell width X2 measurable along direction X and a cell height Y2 measurable along direction Y. In some applications, a memory macro is formed by repeating and abutting memory cells having a configuration identical or mirrored-identical to memory cell 400, and thus cell width X2 is also referred to as a cell pitch along direction X, and cell height Y2 is also referred to as a cell pitch along direction Y. In some embodiments, a ratio of cell width X2 to cell height Y2 is greater than one.

In some embodiments, cell height Y1 equals cell height Y2. In some embodiments, a ratio of cell width X2 to cell width X1 is greater than 1.15. In some embodiments, the ratio of cell width X2 to cell width X1 ranges from 1.23 to 1.25. In some embodiments, in a given manufacturing process, the ratio of cell width X2 to cell width X1 is determinable based on the additional width usable to accommodate the formation of additional active structures, such as active structures 412a/412b versus active structure 312 for transistor N1 and pass gate device PG1 or active structures 414a/414b versus active structure 314 for transistor N2 and pass gate device PG2.

Figure 5:
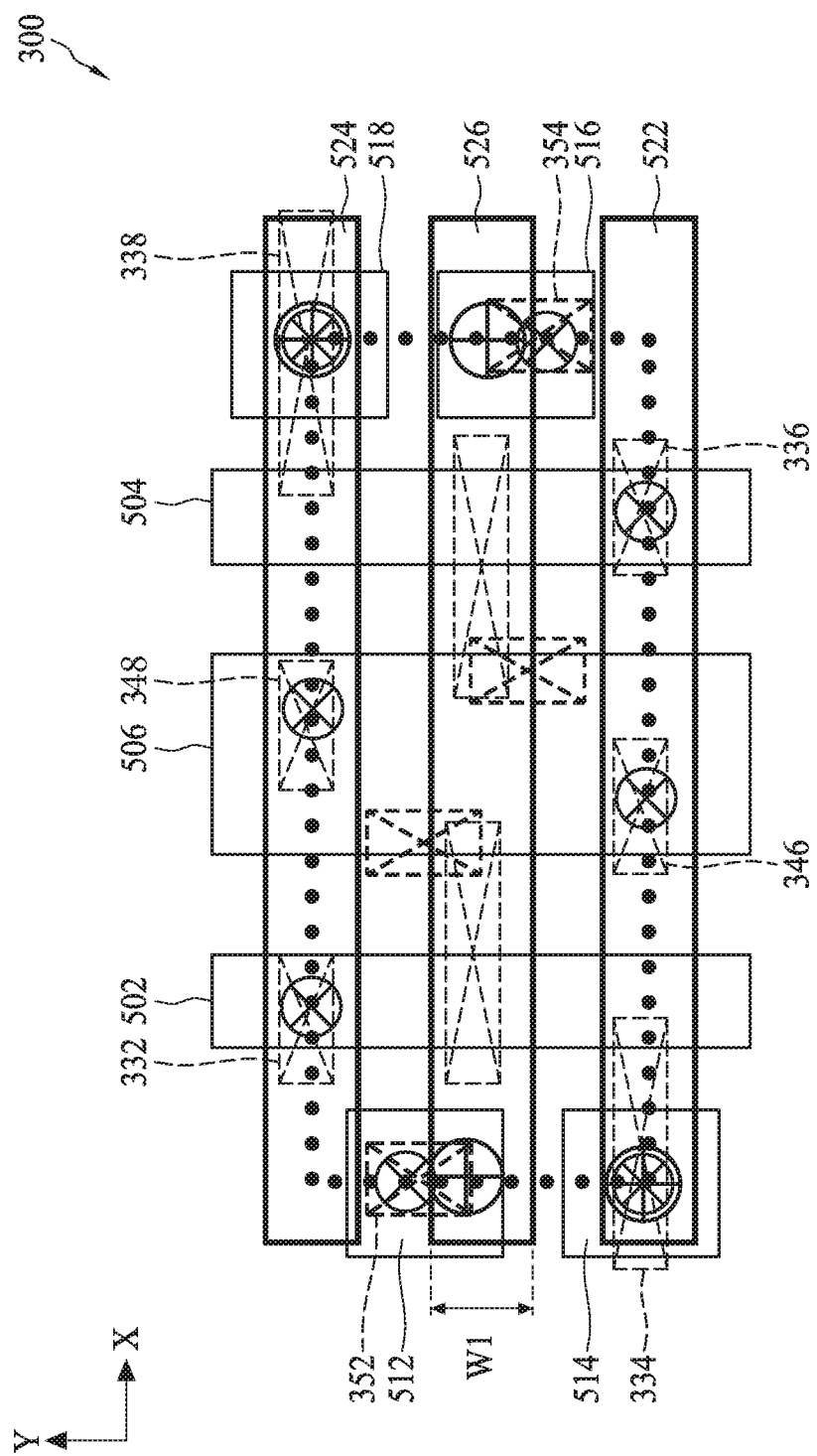
FIG. 5 is a top view of the first type memory cell in FIG. 3, with emphasis of the components at the first metal layer and a second metal layer of the chip, in accordance with some embodiments.

FIG. 5 is a top view of the first type memory cell 300 in FIG. 3, with emphasis of the components at the first metal layer and a second metal layer of the chip, in accordance with some embodiments. Components in FIG. 5 that are the same or similar to those in FIG. 3 are given the same reference numbers, and detailed description thereof is thus omitted. Some components of memory cell 300 are not depicted in FIG. 5, or depicted in dotted lines, or not labeled for clarity of FIG. 5.

Memory cell 300 includes a plurality of conductive line segments 502, 504, 506, 512, 514, 516, 518, 522, 524, and 526. Conductive line segments 502, 504, and 506 extend along direction Y in a first metal layer of a chip in which first type memory cell 300 and second type memory cell 400 are formed. Conductive line segments 512, 514, 516, and 518 function as landing pads and are also in the first metal layer. Conductive lines 512, 514, 516, and 518 are also referred to as landing pads in this disclosure. Conductive line segments 522, 524, and 526 extend along direction X in a second metal layer of the chip. The second metal layer is over the first metal layer. In some embodiments, each segment of conductive line segments 522, 524, and 526 is a portion of a corresponding reference line or word line that extends along direction X and electrically coupled with all memory cells of the same row. Memory cell 300 includes a plurality of via plugs VO connecting conductive line segments of the first metal layer with corresponding active contact structures 332, 334, 336, and 338 and gate contact structures 352 and 354. Memory cell 300 further includes a plurality of via plugs V1 connecting various landing pads 512, 514, 516, and 518 of the first metal layer with various conductive line segments 522, 524, and 526 of the second metal layer.

Figure 8:
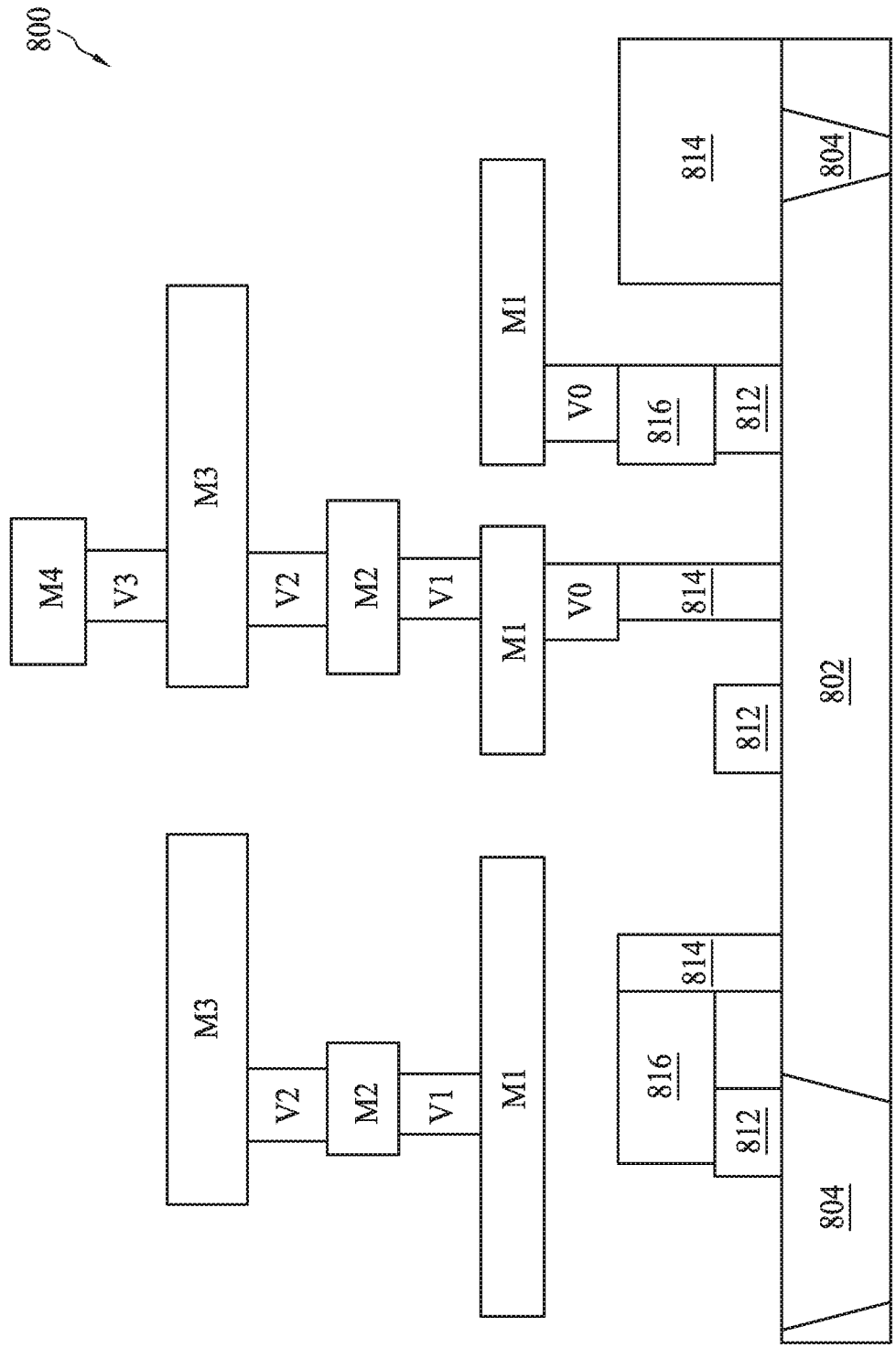
FIG. 8 is a cross-sectional view of a portion of a chip, in accordance with some embodiments.

The second metal layer of the chip, via plugs VO, and via plugs V1 will be further illustrated in conjunction with FIG. 8.

Conductive line segment 502 extends along direction Y and is electrically coupled with active contact structure 332 through a corresponding via plug VO. Conductive line segment 502 is thus electrically coupled with node NBL of first type memory cell 300. In some embodiments, conductive line segment 502 is a bit line segment that constitutes a portion of a bit line BL of a column of first type memory cells where first type memory cell 300 is disposed. Conductive line segment 504 extends along direction Y and is electrically coupled with active contact structure 336 through a corresponding via plug VO. Conductive line segment 504 is thus electrically coupled with node NBLB of first type memory cell 300. In some embodiments, conductive line segment 504 is a bit line segment that constitutes a portion of a bit line BLB of the column of first type memory cells where first type memory cell 300 is disposed.

Conductive line segment 506 extends along direction Y and is electrically coupled with active contact structures 346 and 348 through corresponding via plugs VO. Conductive line segment 506 is thus electrically coupled with node NVDD of first type memory cell 300. In some embodiments, conductive line segment 506 is a supply voltage line segment that constitutes a portion of a supply voltage line of the column of first type memory cells where first type memory cell 300 is disposed.

Landing pad 512 and landing pad 514 are aligned along direction Y. Landing pad 512 is electrically coupled with gate contact structure 352 through a corresponding via plug VO. Landing pad 512 is thus electrically coupled with the gate or control terminal of pass gate device PG1 of first type memory cell 300. In some embodiments, landing pad 512 is also referred to as a word line landing pad of first type memory cell 300. Landing pad 514 is electrically coupled with active contact structure 334 through a corresponding via plug VO. Landing pad 514 is thus electrically coupled with node NVSS of first type memory cell 300. In some embodiments, landing pad 514 is also referred to as a reference line landing pad of first type memory cell 300.

Landing pad 516 and landing pad 518 are aligned along direction Y. Landing pad 516 is electrically coupled with gate contact structure 354 through a corresponding via plug VO. Landing pad 516 is thus electrically coupled with the gate or control terminal of pass gate device PG2 of first type memory cell 300. In some embodiments, landing pad 516 is also referred to as another word line landing pad of first type memory cell 300. Landing pad 518 is electrically coupled with active contact structure 338 through a corresponding via plug VO. Landing pad 518 is thus electrically coupled with node NVSS of first type memory cell 300. In some embodiments, landing pad 514 is also referred to as another reference line landing pad of first type memory cell 300.

Conductive line segment 522 extends along direction X and is electrically coupled with reference line landing pad 514 through a corresponding via plug V1. Conductive line segment 522 is thus electrically coupled with node NVSS of first type memory cell 300. In some embodiments, conductive line segment 522 is a reference line segment that constitutes a portion of a reference voltage line of a row of first type memory cells where first type memory cell 300 is disposed. Conductive line segment 524 extends along direction X and is electrically coupled with reference line landing pad 518 through a corresponding via plug V1. Conductive line segment 524 is thus also electrically coupled with node NVSS of first type memory cell 300. In some embodiments, conductive line segment 524 is another reference line segment that constitutes a portion of another reference voltage line of the row of first type memory cells where first type memory cell 300 is disposed.

Conductive line segment 526 extends along direction X and is electrically coupled with word line landing pads 512 and 516 through corresponding via plugs V1. Conductive line segment 526 is thus electrically coupled with control terminals of pass gate devices PG1 and PG2 of first type memory cell 300. In some embodiments, conductive line segment 526 is a word line segment that constitutes a portion of a word line of the row of first type memory cells where first type memory cell 300 is disposed. Conductive line segment 526 has a line width W1 measurable along direction Y.

Figure 6:
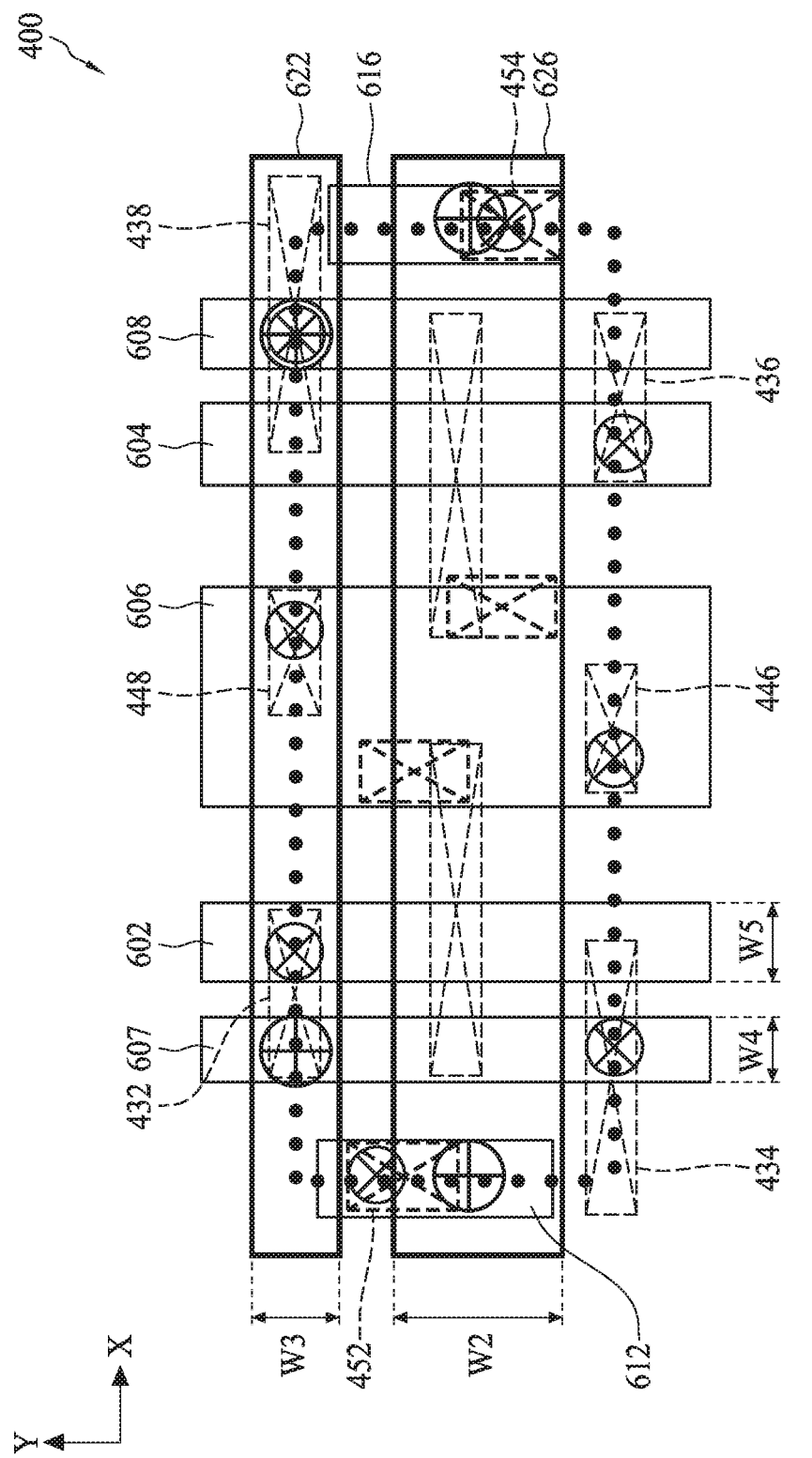
FIG. 6 is a top view of the second type memory cell in FIG. 4, with emphasis of the components at the first metal layer and the second metal layer of the chip, in accordance with some embodiments.

FIG. 6 is a top view of the second type memory cell 400 in FIG. 4, with emphasis of the components at the first metal layer and the second metal layer of the chip, in accordance with some embodiments. Components in FIG. 6 that are the same or similar to those in FIG. 4 are given the same reference numbers, and detailed description thereof is thus omitted. Some components of memory cell 400 are not depicted in FIG. 6, or depicted in dotted lines, or not labeled for clarity of FIG. 6.

Memory cell 400 includes a plurality of conductive line segments 602, 604, 606, 607, 608, 612, 616, 622, and 626. Conductive line segments 602, 604, 606, 607, and 608 extend along direction Y in the first metal layer of the chip in which first type memory cell 300 and second type memory cell 400 are formed. Conductive line segments 612 and 616 function as landing pads and are also in the first metal layer. Conductive lines 612 and 616 are also referred to as landing pads in this disclosure. Conductive line segments 622 and 626 extend along direction X in the second metal layer of the chip. In some embodiments, each segment of conductive line segments 622 and 626 is a portion of a corresponding reference line or word line that extends along direction X and electrically coupled with all memory cells of the same row. Memory cell 400 includes a plurality of via plugs VO connecting conductive line segments of the first metal layer with corresponding active contact structures 432, 434, 436, and 438 and gate contact structures 452 and 454. Memory cell 400 further includes a plurality of via plugs V1 connecting various landing pads 612 and 616 and conductive lines 607 and 608 of the first metal layer with various conductive line segments 622 and 626 of the second metal layer.

Conductive line segment 602 extends along direction Y and is electrically coupled with active contact structure 432 through a corresponding via plug VO. Conductive line segment 602 is thus electrically coupled with node NBL of second type memory cell 400. In some embodiments, conductive line segment 602 is a bit line segment that constitutes a portion of a bit line BL of a column of second type memory cells where second type memory cell 400 is disposed. Conductive line segment 604 extends along direction Y and is electrically coupled with active contact structure 436 through a corresponding via plug VO. Conductive line segment 604 is thus electrically coupled with node NBLB of second type memory cell 400. In some embodiments, conductive line segment 604 is a bit line segment that constitutes a portion of a bit line BLB of the column of second type memory cells where second type memory cell 400 is disposed.

Conductive line segment 606 extends along direction Y and is electrically coupled with active contact structures 446 and 448 through corresponding via plugs VO. Conductive line segment 606 is thus electrically coupled with node NVDD of second type memory cell 400. In some embodiments, conductive line segment 606 is a supply voltage line segment that constitutes a portion of a supply voltage line of the column of second type memory cells where second type memory cell 400 is disposed.

Conductive line segment 607 extends along direction Y and is electrically coupled with active contact structure 434 through a corresponding via plug VO. Conductive line segment 607 is thus electrically coupled with node NVSS of second type memory cell 400. In some embodiments, conductive line segment 607 is a reference line segment that constitutes a portion of a reference line of a column of second type memory cells where second type memory cell 400 is disposed. Conductive line segment 608 extends along direction Y and is electrically coupled with active contact structure 438 through a corresponding via plug VO. Conductive line segment 608 is thus also electrically coupled with node NVSS of second type memory cell 400. In some embodiments, conductive line segment 608 is another reference line segment that constitutes a portion of another reference line of the column of second type memory cells where second type memory cell 400 is disposed.

Landing pad 612 is electrically coupled with gate contact structure 452 through a corresponding via plug VO. Landing pad 612 is thus electrically coupled with the gate or control terminal of pass gate device PG1 of second type memory cell 400. Landing pad 616 is electrically coupled with gate contact structure 454 through a corresponding via plug VO. Landing pad 616 is thus electrically coupled with the gate or control terminal of pass gate device PG2 of second type memory cell 400. In some embodiments, landing pad 612 and landing pad 616 are also referred to as word line landing pads of second type memory cell 400.

Compared with word line landing pad 512 and reference line landing pad 514 of first type memory cell 400, word line landing pad 612 and reference line segment 607 are spaced apart along direction X. Also, compared with word line landing pad 516 and reference line landing pad 518 of first type memory cell 400, word line landing pad 616 and reference line segment 608 are spaced apart along direction X.

Conductive line segment 622 extends along direction X and is electrically coupled with reference line segments 607 and 608 through corresponding via plugs V1. Conductive line segment 622 is thus electrically coupled with node NVSS of second type memory cell 400. In some embodiments, conductive line segment 622 is a reference line segment that constitutes a portion of a reference voltage line of a row of second type memory cells where second type memory cell 400 is disposed.

Conductive line segment 626 extends along direction X and is electrically coupled with word line landing pads 612 and 616 through corresponding via plugs V1. Conductive line segment 626 is thus electrically coupled with control terminals of pass gate devices PG1 and PG2 of second type memory cell 400. In some embodiments, conductive line segment 626 is a word line segment that constitutes a portion of a word line of the row of second type memory cells where second type memory cell 400 is disposed. Conductive line segment 626 has a line width W2 measurable along direction Y.

In some embodiments, the cell height Y1 of first type memory cell 300 is the same as the cell height Y2 of second type memory cell 400. In some embodiments, for the same cell height, first type memory cell 300 is configured to correspond to two reference line segments 522 and 524 and one word line segment 526 while second type memory cell 400 is configured to correspond to only one reference line segment 622 and one word line segment 626. As such, in some embodiments, line width W2 of word line segment 626 of the second type memory cell 400 is set to be greater than line width W1 of word line segment 526 of first type memory cell 300. In some embodiments, a ratio of line width W2 to line width W1 is greater than 1.5.

Furthermore, reference line segment 622 has a line width W3 measurable along direction Y. In some embodiments, line width W2 is set to be greater than line width W3. Reference line segment 607 has a line width W4 measurable along direction X; and bit line segment 602 has a line width W5 measurable along direction X. In some embodiments, line width W5 is set to be greater than line width W4. In some embodiments, a ratio of line width W5 to line width W4 is greater than 1.1.

Figure 7:
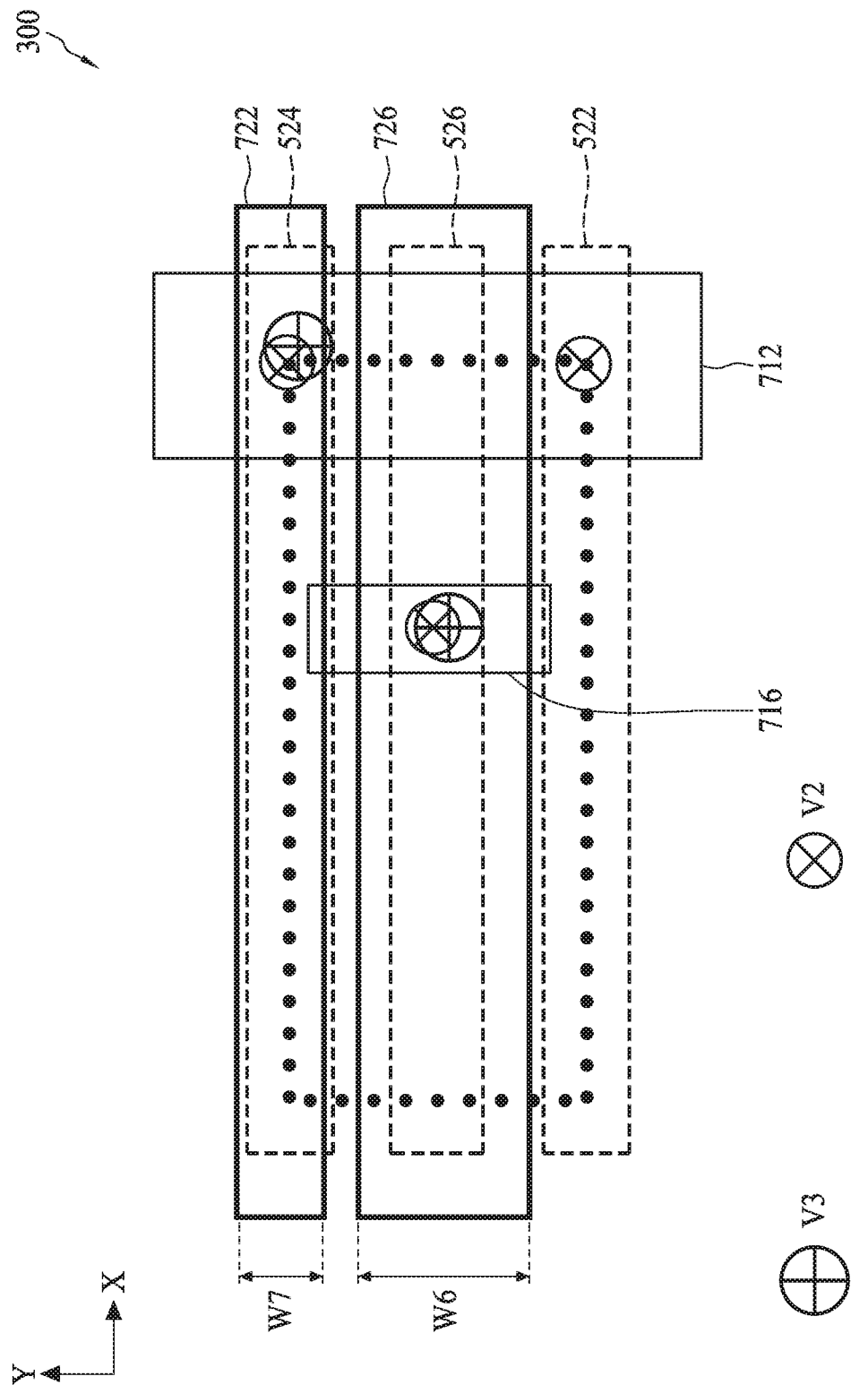
FIG. 7 is a top view of the first type memory cell in FIG. 3, with emphasis of the components at a third metal layer and a fourth metal layer of the chip, in accordance with some embodiments.

FIG. 7 is a top view of the first type memory cell 300 in FIG. 3, with emphasis of the components at a third metal layer and a fourth metal layer of the chip, in accordance with some embodiments. Components in FIG. 7 that are the same or similar to those in FIG. 5 are given the same reference numbers, and detailed description thereof is thus omitted. Some components of memory cell 300 are not depicted in FIG. 7, or depicted in dotted lines, or not labeled for clarity of FIG. 7.

Memory cell 300 includes a plurality of conductive line segments 712, 716, 722, and 726. Conductive line segment 712 extends along direction Y in the third metal layer of the chip in which first type memory cell 300 and second type memory cell 400 are formed. Conductive line segment 716 functions as a landing pad and is also in the third metal layer. Conductive line segment 716 is also referred to as a landing pad in this disclosure. Conductive line segments 722 and 726 extend along direction X in the fourth metal layer of the chip. In some embodiments, each segment of conductive line segments 722 and 726 is a portion of a corresponding reference line or word line that extends along direction X and electrically coupled with all memory cells of the same row. Memory cell 300 includes a plurality of via plugs V2 connecting conductive line segments of the second metal layer with corresponding conductive line segments of the third metal layer. Memory cell 300 further includes a plurality of via plugs V3 connecting conductive line segments of the third metal layer with corresponding conductive line segments of the fourth metal layer.

The third metal layer of the chip, the fourth metal layer, via plugs V2, and via plugs V3 will be further illustrated in conjunction with FIG. 8.

Conductive line segment 712 extends along direction Y and is electrically coupled with conductive lines 522 and 524 through corresponding via plugs V2. Conductive line segment 712 is thus electrically coupled with node NVSS of second type memory cell 300. In some embodiments, conductive line segment 712 is a reference line segment that constitutes a portion of a reference line of a column of first type memory cells where first type memory cell 300 is disposed.

Landing pad 716 is electrically coupled with conductive line segment 526 through a corresponding via plug V2. Landing pad 716 is thus electrically coupled with the gates or control terminals of pass gate devices PG 1 and PG2 of first type memory cell 300. In some embodiments, landing pad 716 is referred to as another word line landing pad of second type memory cell 300.

Conductive line segment 722 extends along direction X and is electrically coupled with reference line segment 712 through a corresponding via plug V3. Conductive line segment 722 is thus electrically coupled with node NVSS of first type memory cell 300. In some embodiments, conductive line segment 722 is a reference line segment that constitutes a portion of a reference voltage line of a row of first type memory cells where first type memory cell 300 is disposed.

Conductive line segment 726 extends along direction X and is electrically coupled with word line landing pad 716 through a corresponding via plug V3. Conductive line segment 726 is thus electrically coupled with control terminals of pass gate devices PG1 and PG2 of first type memory cell 300. In some embodiments, conductive line segment 726 is a word line segment that constitutes a portion of a word line of the row of first type memory cells where first type memory cell 300 is disposed.

Conductive line segment 726 has a line width W6 measurable along direction Y. Conductive line segment 722 has a line width W7 measurable along direction Y. In some embodiments, line width W6 is set to be greater than line width W7.

First type memory cell 300 and second type memory cell 400 illustrated in conjunction with FIGS. 3-7 are provided as an example. In some embodiments, some of various conductive lines and/or landing pads are omitted as long as the resulting first type memory cell 300 and second type memory cell 400 are still consistent with the circuit schematic depicted in FIG. 1.

FIG. 8 is a cross-sectional view of a portion of a chip 800, in which the first type memory cell and the second type memory cell as illustrated in the present application are formed, in accordance with some embodiments. Some components of chip 800 are not depicted for clarity of FIG. 8.

Chip 800 includes a substrate 802, various isolation features 804 buried in substrate 802, a plurality of gate structures 812 formed over substrate 802, a plurality of active contact structures 814 over substrate 802, and a plurality of gate contact structures 816 over various gate structures 812. Chip 800 also includes a plurality of conductive layers, which is also referred to as metal layers in this disclosure, and a plurality of via layers over substrate 802.

The conductive layers of chip 800 include a first metal layer having conductive features M1, a second metal layer having conductive features M2, a third metal layer having conductive features M3, and a fourth metal layer having conductive features M4. The via layers of chip 800 include a base via layer having via plugs VO, a first via layer having via plugs V1, a second via layer having via plugs V2, and a third via layer having via plug V3. Via plugs VO are arranged to connect at least some of active conductive structures 814 and/or gate conductive structures 816 with corresponding first metal layer conductive features M1. Via plugs V1 are arranged to connect at least some first metal layer conductive features M1 with corresponding second metal layer conductive features M2. Via plugs V2 are arranged to connect at least some second metal layer conductive features M2 with corresponding third metal layer conductive features M3. Via plug V3 is arranged to connect a third metal layer conductive feature M3 with a corresponding fourth metal layer conductive feature M4.

FIG. 8 is used as to demonstrate the spatial relationship among various metal layers and via layers. In some embodiments, the numbers of conductive features at various layers are not limited to the example depicted in FIG. 8. In some embodiments, there are one or more metal layers and one or more via layers over the fourth metal layer conductive structure M4.

Figure 9:
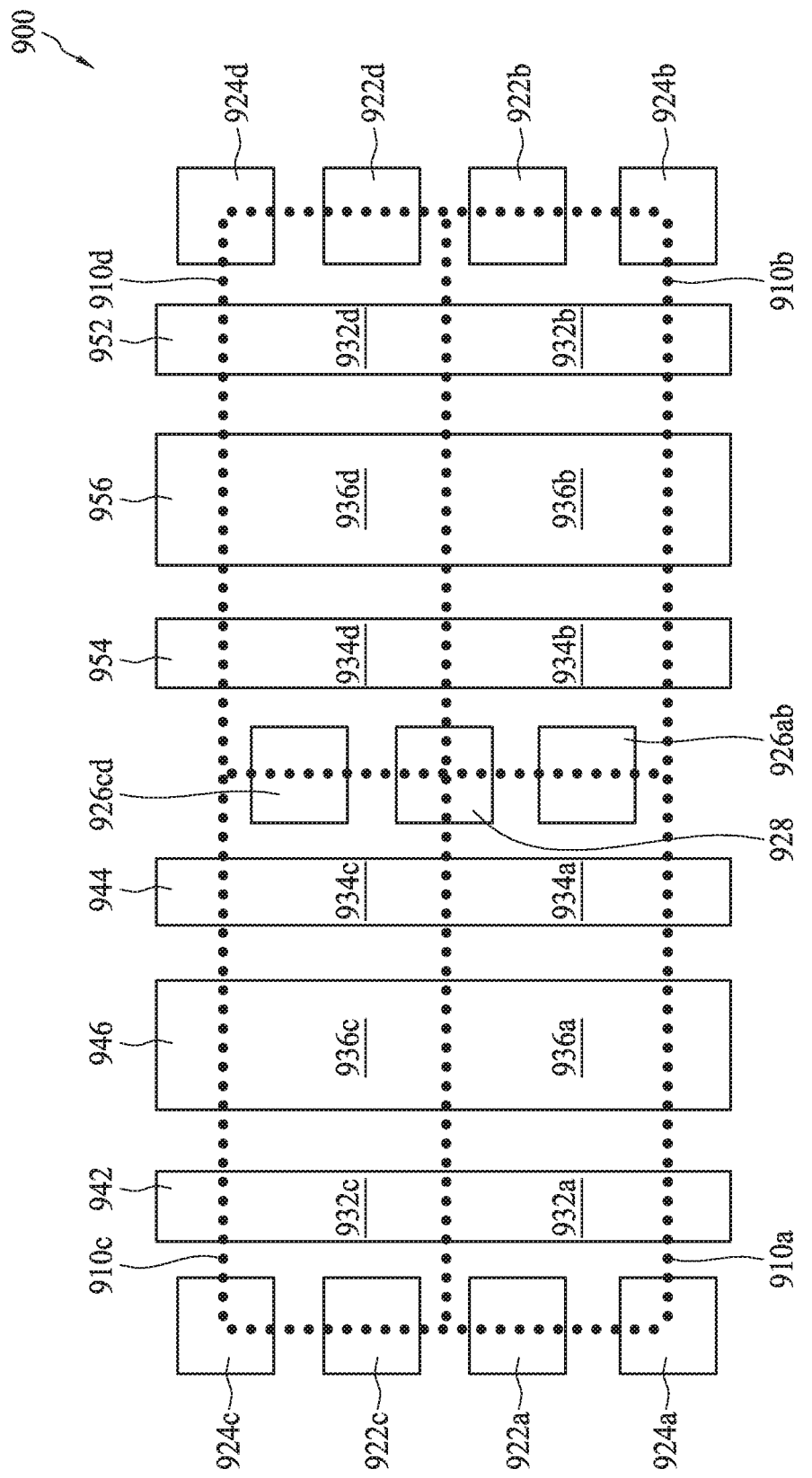
FIG. 9 is a top view of a portion of a first memory device, with emphasis of the components at a first metal layer of a chip, in accordance with some embodiments.

FIG. 9 is a top view of a portion of a first memory device 900, with emphasis of the components at a first metal layer of a chip, in accordance with some embodiments. In some embodiments, first memory device 900 corresponds to first memory device 110 depicted in FIG. 1.

Memory device 900 includes memory cells 910a, 910b, 910c, and 910d. Memory device 900 also includes a plurality of landing pads 922a, 922b, 922c, 922d, 924a, 924b, 924c, 924d, 926ab, 926cd, and 928; a plurality of line segments 932a, 932b, 932c, 932d, 934a, 934b, 934c, 934d, 936a, 936b, 936c, and 936d.

Moreover, memory device 900 includes bit lines 942, 944, 952, and 954 and supply voltage lines 946 and 956. Bit line 942 is formed of at least conductive line segments 932a and 932c; bit line 944 is formed of at least conductive line segments 934a and 934c; bit line 952 is formed of at least conductive line segments 932b and 932d; and bit line 954 is formed of at least conductive line segments 934b and 934d. Supply voltage line 946 is formed of at least conductive line segments 936a and 936c; and supply voltage line 956 is formed of at least conductive line segments 936b and 936d.

Each memory cell of memory cells 910a, 910b, 910c, and 910d is a first type memory cell and has a configuration similar to first type memory cell 300 illustrated in conjunction with FIGS. 3, 5, and 7. For memory cell 910a, landing pads 922a, 924a, 926ab, and 928 correspond to landing pads 512, 514, 516, and 518 in FIG. 5; and conductive line segments 932a, 934a, and 936a correspond to conductive segments 502, 504, and 506 in FIG. 5. For memory cell 910b, landing pads 922b, 924b, 926ab, and 928 corresponding to landing pads 512, 514, 516, and 518 in FIG. 5; and conductive line segments 932b, 934b, and 936b correspond to conductive segments 502, 504, and 506 in FIG. 5. For memory cell 910c, landing pads 922c, 924c, 926cd, and 928 corresponding to landing pads 512, 514, 516, and 518 in FIG. 5; and conductive line segments 932c, 934c, and 936c correspond to conductive segments 502, 504, and 506 in FIG. 5. For memory cell 910d, landing pads 922d, 924d, 926cd, and 928 corresponding to landing pads 512, 514, 516, and 518 in FIG. 5; and conductive line segments 932d, 934d, and 936d correspond to conductive segments 502, 504, and 506 in FIG. 5.

Therefore, detailed description of various landing pads and conductive segments depicted in FIG. 9 is omitted.

Figure 10:
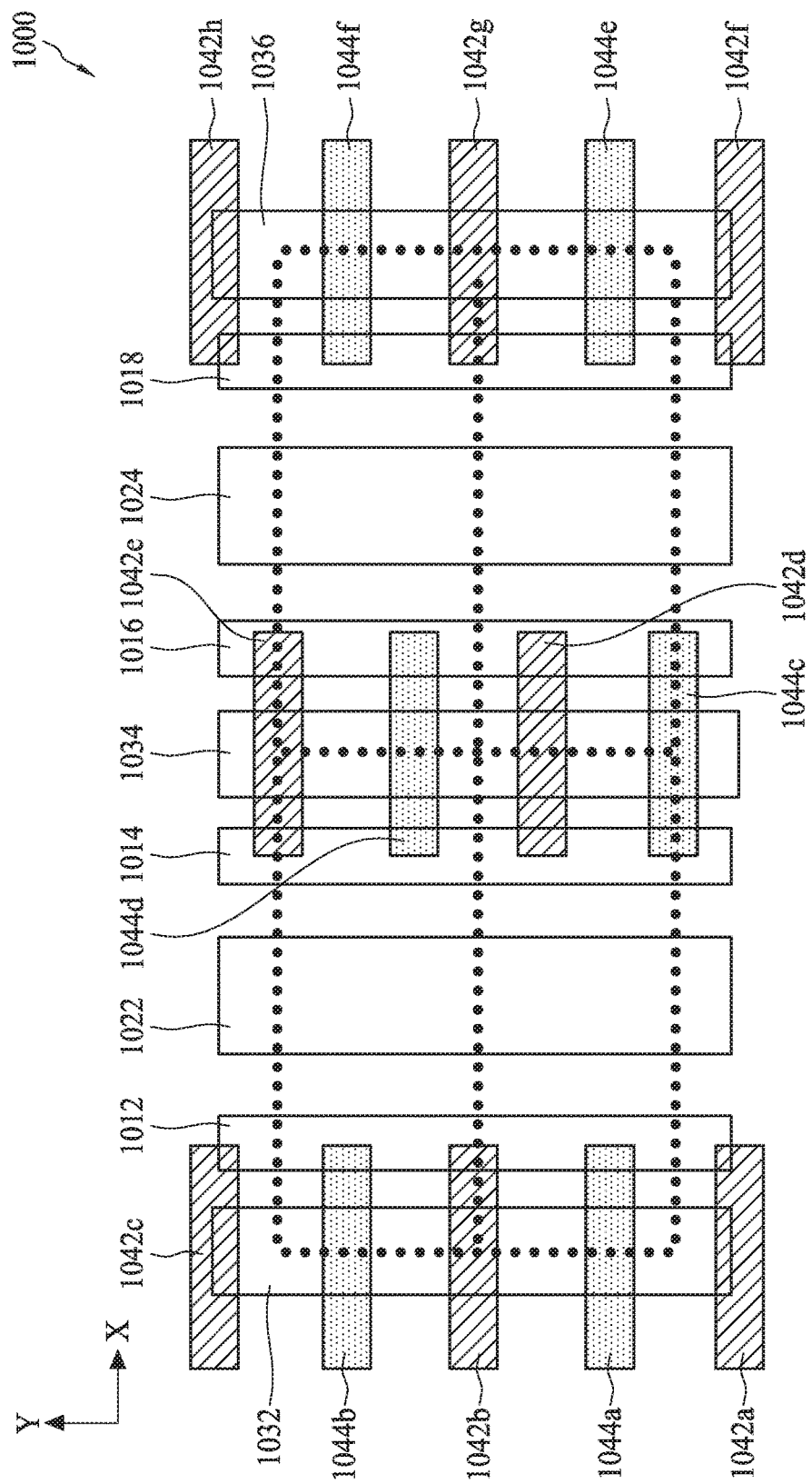
FIG. 10 is a layout diagram of a portion of a layout design for forming the conductive features of the first metal layer in FIG. 9, in accordance with some embodiments.

FIG. 10 is a layout diagram of a portion of a layout design 1000 for forming the conductive features of the first metal layer in FIG. 9, in accordance with some embodiments.

Layout design 1000 includes a first set of conductive layout patterns 1012, 1014, 1016, and 1018; a second set of conductive layout patterns 1022, 1024, 1032, 1034, and 1036; a first set of cutting layout patterns 1042a-1042h; and a second set of cutting layout patterns 1044a-1044f. Conductive layout patterns 1012, 1014, 1016, and 1018 extend along direction Y and are usable to form conductive lines 942, 944, 954, and 952 in FIG. 9. Conductive layout patterns 1022, 1024, 1032, 1034, and 1036 extend along direction Y and are usable to form conductive lines 946 and 956 in FIG. 9 and conductive lines on which landing pads 924a-928 are based. First set of conductive layout patterns 1012, 1014, 1016, and 1018 and second set of conductive layout patterns 1022, 1024, 1032, 1034, and 1036 are used during two distinctive patterning processes. First set of cutting layout patterns 1042a-1042h and second set of cutting layout patterns each extend along direction X and are arranged along direction Y in an alternating manner. First set of cutting layout patterns 1042a-1042h and second set of cutting layout patterns are used in conjunction with conductive layout patterns 1032, 1034, and 1036 in order to form various landing pads by trimming the resulting conductive lines based on conductive layout patterns 1032, 1034, and 1036 or by forming blocking structures to intervene the formation of conductive lines based on conductive layout patterns 1032, 1034, and 1036.

FIGS. 11A-11E are top views of a portion of the first memory device 900 in FIG. 9 at various stages of forming the first metal layer of the chip according to a first manufacturing process, in accordance with some embodiments. The formation of landing pads 926ab, 926cd, and 928 based on conductive layout pattern 1034 and cutting layout patterns 1042d, 1042e, 1044c, and 1044d are illustrated in conjunction with FIGS. 11A-11E as an example.

Figure 11:
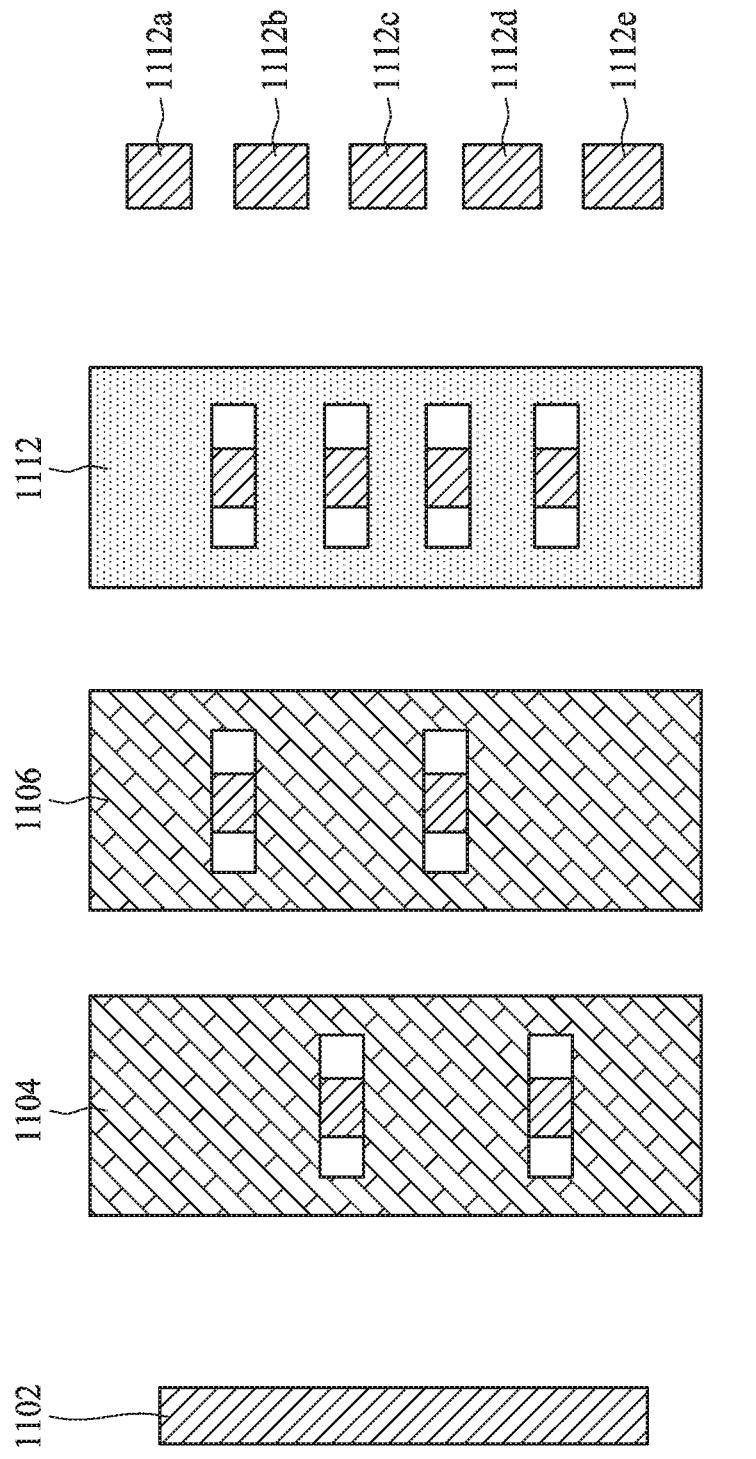
FIGS. 11A-11E are top views of a portion of the first memory device in FIG. 9 at various stages of forming the first metal layer of the chip according to a first manufacturing process, in accordance with some embodiments.

In FIG. 11A, a conductive line 1102 is formed over a substrate based on conductive layout pattern 1034. In FIG. 11B, a first lithographic process is performed to form in a photoresist layer 1104 a set of openings based on cutting layout patterns 1044c and 1044d. The openings in photoresist layer 1104 are transferred to a mask layer 1112 (FIG. 11D) to form a first set of etching windows in the mask layer 1112. In FIG. 11C, a second lithographic process is performed to form in a photoresist layer 1106 a set of openings based on cutting layout patterns 1042d and 1042e. The openings in photoresist layer 1106 are transferred to the mask layer 1112 to form a second set of etching windows in the mask layer 1112. In FIG. 11D, the resulting mask layer 1112 now includes four etching windows defined based on cutting layout patterns 1042d, 1042e, 1044c, and 1044d.

In FIG. 11E, portions of the conductive line 1102 that are exposed by the set of etching windows in the mask layer 1112 are removed to trim conductive line 1102 into landing pads 1112a, 1112b, 1112c, 1112d, and 1112e. In this embodiment, landing pads 1112b, 1112c, and 1112d correspond to landing pads 926cd, 928, and 926ab in FIG. 9.

FIGS. 12A-12E are top views of a portion of the first memory device 900 in FIG. 9 at various stages of forming the first metal layer of the chip according to a second manufacturing process, in accordance with some embodiments. The formation of landing pads 926ab, 926cd, and 928 based on conductive layout pattern 1034 and cutting layout patterns 1042d, 1042e, 1044c, and 1044d are illustrated in conjunction with FIGS. 12A-12E as an example.

In FIG. 12A, a first lithographic process is performed to form a first set of blocking structures 1212 over a dielectric layer 1202 based on a first set of cutting layout patterns 1044c and 1044d. In FIG. 12B, a second lithographic process is performed to form a second set of blocking structures 1214 over dielectric layer 1202 based on a second set of cutting layout patterns 1042d and 1042e. In FIG. 12C, a mask layer 1222 is formed over the blocking structures 1212 and 1214. The mask layer 1222 has an opening 1224 therein, and the opening 1224 is formed based on conductive line layout pattern 1034.

In FIG. 12D, recesses 1232a-1232e are formed in portions of the dielectric layer 1202 that are exposed by the opening 1224 of mask layer 1222 and not covered by the blocking structures 1212 and 1214. In FIG. 12E, the recesses are filled with a conductive material to form landing pads 1234a, 1234b, 1234c, 1234d, and 1234e. In some embodiments, the conductive material includes Cu, Ni, TaN, TiN, W, or a combination thereof. In this embodiment, landing pads 1234b, 1234c, and 1234d correspond to landing pads 926cd, 928, and 926ab in FIG. 9.

Figure 13:
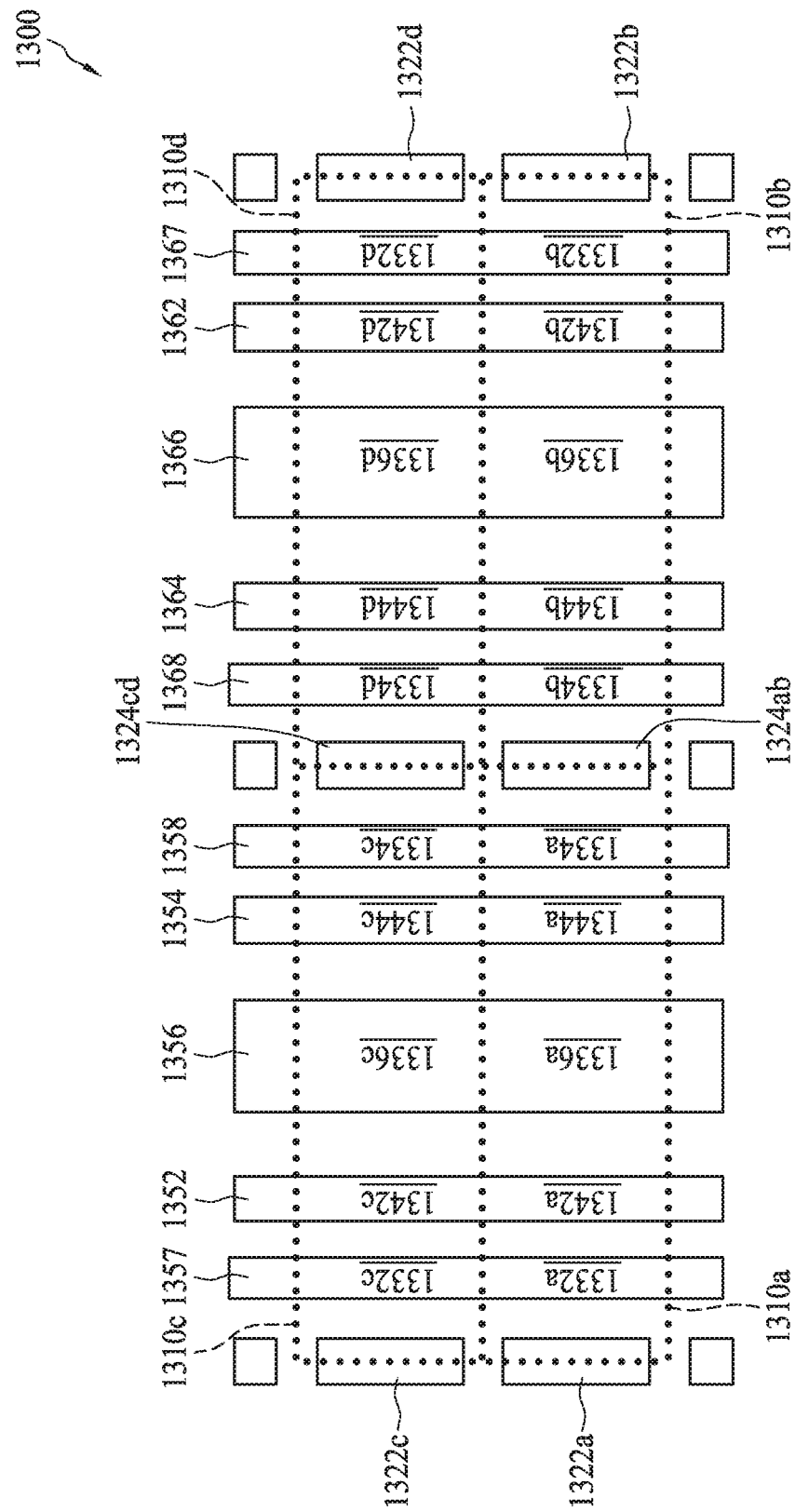
FIG. 13 is a top view of a portion of a second memory device, with emphasis of the components at the first metal layer of the chip, in accordance with some embodiments.

FIG. 13 is a top view of a portion of a second memory device 1300, with emphasis of the components at the first metal layer of the chip, in accordance with some embodiments. In some embodiments, second memory device 1300 corresponds to second memory device 140 depicted in FIG. 1.

Memory device 1300 includes memory cells 1310a, 1310b, 1310c, and 1310d. Memory device 1300 also includes a plurality of landing pads 1322a, 1322b, 1322c, 1322d, 1324ab, and 1324cd; a plurality of line segments 1332a-1332d, 1334a-1334d, 1336a-1336d, 1342a-1342d, and 1344a-1344d.

Moreover, memory device 1300 includes bit lines 1352, 1354, 1362, and 1364; supply voltage lines 1356 and 1366;

and reference lines 1357, 1358, 1367, and 1368. Bit line 1352 is formed of at least conductive line segments 1342*a* and 1342*c;* bit line 1354 is formed of at least conductive line segments 1344*a* and 1344*c;* bit line 1362 is formed of at least conductive line segments 1342*b* and 1342*d;* and bit line 1364 is formed of at least conductive line segments 1344*b* and 1344*d.* Supply voltage line 1356 is formed of at least conductive line segments 1336*a* and 1336*c;* and supply voltage line 1366 is formed of at least conductive line segments 1336*b* and 1336*d.* Reference line 1357 is formed of at least conductive line segments 1332*a* and 1332*c;* reference line 1358 is formed of at least conductive line segments 1334*a* and 1334*c;* reference line 1367 is formed of at least conductive line segments 1332*b* and 1332*d;* and reference line 1368 is formed of at least conductive line segments 1344*b* and 1344*d.*

Each memory cell of memory cells 1310*a*, 1310*b*, 1310*c*, and 1310*d* is a second type memory cell and has a configuration similar to second type memory cell 400 illustrated in conjunction with FIGS. 4 and 6. For memory cell 1310*a*, landing pads 1322*a* and 1324*ab* correspond to landing pads 612 and 616 in FIG. 6; conductive line segments 1342*a*, 1344*a*, and 1336*a* correspond to conductive segments 602, 604, and 606 in FIG. 6; and conductive line segments 1332*a* and 1334*a* correspond to conductive segments 607 and 608 in FIG. 6. For memory cell 1310*b*, landing pads 1322*b* and 1324*ab* correspond to landing pads 612 and 616 in FIG. 6; conductive line segments 1342*b*, 1344*b*, and 1336*b* correspond to conductive segments 602, 604, and 606 in FIG. 6; and conductive line segments 1342*b* and 1334*b* correspond to conductive segments 607 and 608 in FIG. 6. For memory cell 1310*c*, landing pads 1322*c* and 1324*cd* correspond to landing pads 612 and 616 in FIG. 6; conductive line segments 1342*c*, 1344*c*, and 1336*c* correspond to conductive segments 602, 604, and 606 in FIG. 6; and conductive line segments 1332*c* and 1334*c* correspond to conductive segments 607 and 608 in FIG. 6. For memory cell 1310*d*, landing pads 1322*d* and 1324*cd* correspond to landing pads 612 and 616 in FIG. 6; conductive line segments 1342*d*, 1344*d*, and 1336*d* correspond to conductive segments 602, 604, and 606 in FIG. 6; and conductive line segments 1342*d* and 1334*d* correspond to conductive segments 607 and 608 in FIG. 6. Therefore, detailed description of various landing pads and conductive segments depicted in FIG. 13 is omitted.

Figure 14:
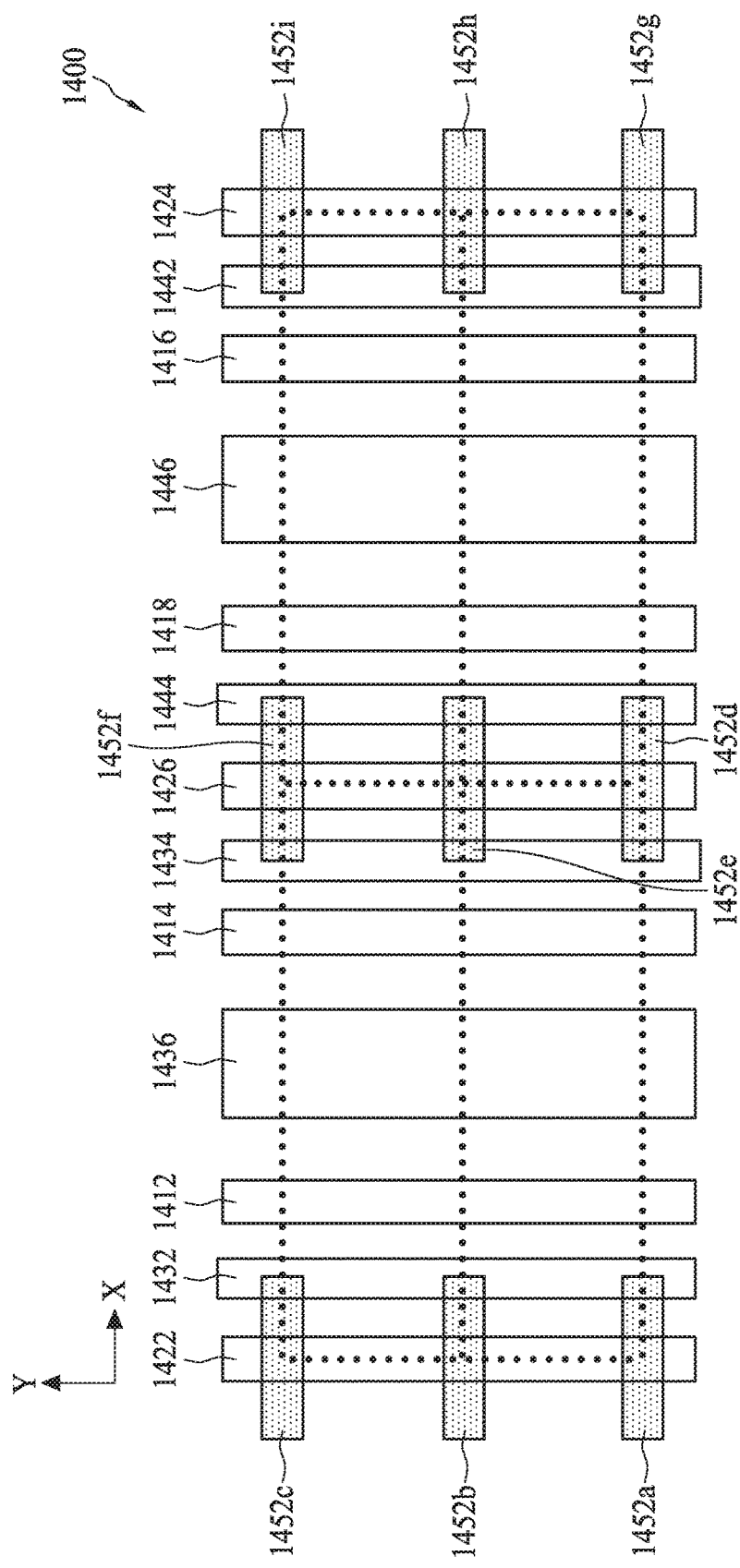
FIG. 14 is a layout diagram of a portion of a layout design for forming the conductive features of the first metal layer in FIG. 13, in accordance with some embodiments.

FIG. 14 is a layout diagram of a portion of a layout design 1400 for forming the conductive features of the first metal layer in FIG. 13, in accordance with some embodiments.

Layout design 1400 includes a first set of conductive layout patterns 1412, 1414, 1416, 1418, 1422, 1424, and 1426; a second set of conductive layout patterns 1432, 1434, 1436, 1442, 1444, and 1446; and a set of cutting layout patterns 1452*a*-1452*g*. First set of conductive layout patterns 1412, 1414, 1416, 1418, 1422, 1424, and 1426 extend along direction Y and are usable to form conductive lines 1352, 1354, 1362, and 1364 in FIG. 13 and conductive lines on which landing pads 1322*a*-1324*cd* are based. Second set of conductive layout patterns 1432, 1434, 1436, 1442, 1444, and 1446 extend along direction Y and are usable to form conductive lines 1357, 1358, 1356, 1367, 1368, and 1366 in FIG. 13. First set of conductive layout patterns 1412, 1414, 1416, 1418, 1422, 1424, and 1426 and second set of conductive layout patterns 1432, 1434, 1436, 1442, 1444, and 1446 are used during two distinctive patterning processes. Cutting layout patterns 1452*a*-1452*g* extend along direction X and are used in conjunction with conductive layout patterns 1422, 1424, and 1426 in order to form various landing pads by trimming the resulting conductive lines based on conductive layout patterns 1422, 1424, and 1426 or by forming blocking structures to intervene the formation of conductive lines based on conductive layout patterns 1422, 1424, and 1426. In some embodiments, various conductive lines and landing pads are formed in a manner similar to those illustrated in conjunction with FIGS. 11A-11E or FIGS. 12A-12E.

Figure 15:
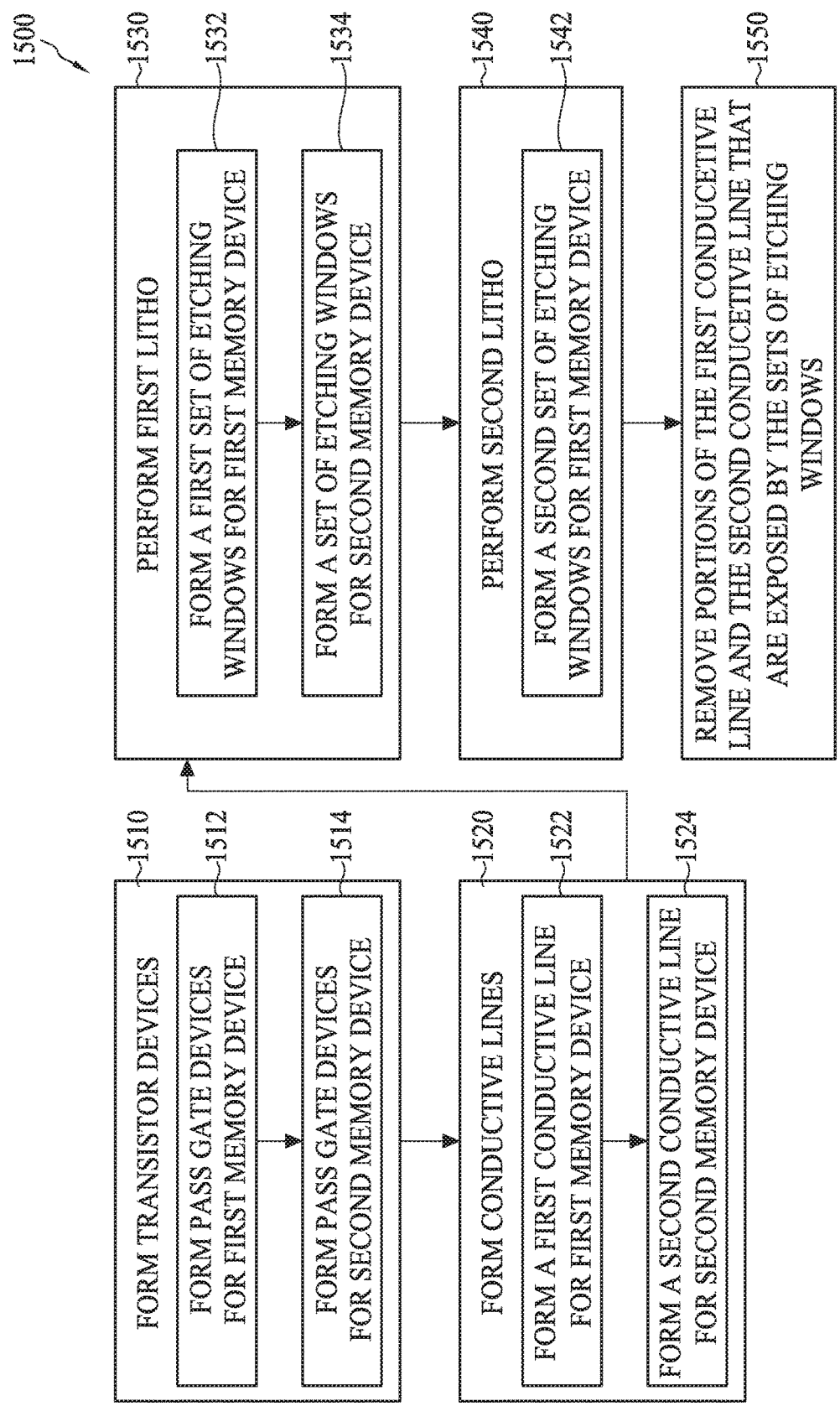
FIG. 15 is a flowchart of a method of forming an IC chip according to the first manufacturing process in FIGS. 11A-11E, in accordance with some embodiments.

FIG. 15 is a flowchart of a method 1500 of forming an IC chip according to the first manufacturing process in FIGS. 11A-11E, in accordance with some embodiments. It is understood that additional operations may be performed before, during, and/or after the method 1500 depicted in FIG. 15, and that some other processes may only be briefly described herein.

Method 1500 begins with operation 1510, where various transistors of memory device 110 and 120 (FIG. 1) are formed. Operation 1510 includes forming pass gate devices PG1/PG2 for first type memory cells of first memory device 110 (operation 1512) and forming pass gate devices PG1/PG2 for second type memory cells of second memory device 120 (operation 1514). In some embodiments, each pass gate device of the pass gate devices of the first type memory cells has a first driving capability; and each pass gate device of the pass gate devices of the second type memory cells has a second driving capability. In some embodiments, the second driving capability is greater than the first driving capability.

Method 1500 proceeds to operation 1520, where conductive lines at a first metal layer of the chip are formed based on conductive line layout patterns. For example, operation 1520 includes operation 1522, where conductive lines for first type memory cells of first memory device 110 are formed based on conductive line layout patterns 1012-1036 (FIG. 10). Operation 1520 includes operation 1524, where conductive lines for second type memory cells of second memory device 120 are formed based on conductive line layout patterns 1412-1446 (FIG. 14). A resulting conductive line 1102 is depicted in FIG. 11A as an example.

Method 1500 proceeds to operation 1530, where a first lithographic process is performed to form a first set of etching windows in a mask layer based on a first set of cutting layout patterns. For example, two etching windows in mask layer 1112 (FIG. 11D) are formed based on cutting layout patterns 1044*c* and 1044*d* (FIG. 10). Operation 1530 includes forming the mask layer 1112 for first type memory cells of first memory device 110 in operation 1532 and forming the mask layer 1112 for second type memory cells of second memory device 120.

Method 1500 proceeds to operation 1540, where a second lithographic process is performed to form a second set of etching windows in the mask layer based on a second set of cutting layout patterns. For example, two other etching windows in mask layer 1112 (FIG. 11D) are formed based on cutting layout patterns 1042*d* and 1042*e* (FIG. 10). Operation 1540 includes forming the mask layer 1112 for first type memory cells of first memory device 110 in operation 1542. In some embodiments, operation 1534 is performed as part of operation 1540 and is not part of operation 1530.

Method 1500 proceeds to operation 1550, where portions of the conductive lines that are exposed by the etching windows in the mask layer 1112 are removed. A plurality of landing pads are formed as a result of trimming the conductive lines based on operations 1530-1550. As an example, FIG. 11E is a diagram of a plurality of resulting landing pads 1112*a*-1112*e*.

Figure 16:
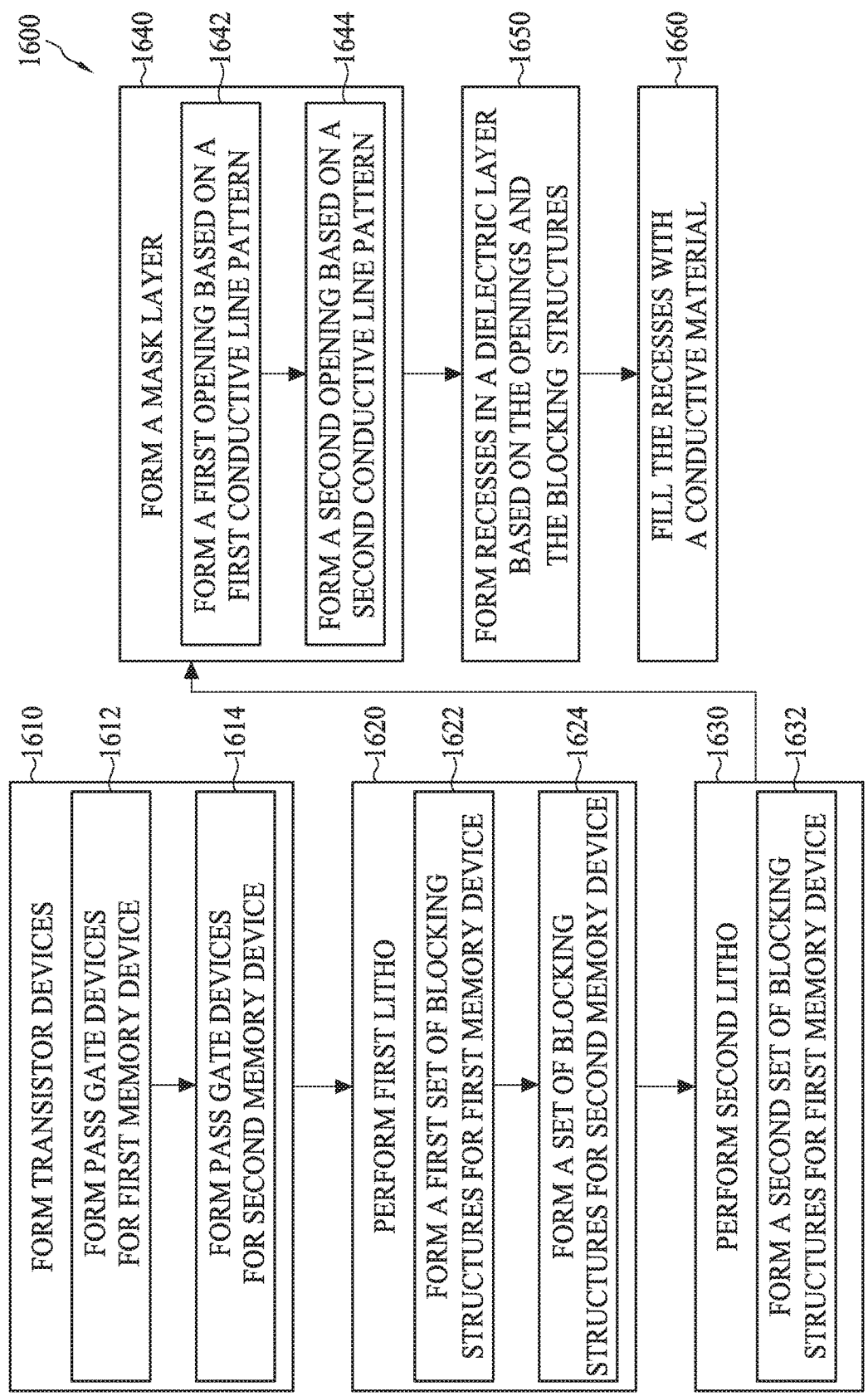
FIG. 16 is a flowchart of a method of forming an IC chip according to the second manufacturing process in FIGS. 12A-12E, in accordance with some embodiments.

FIG. 16 is a flowchart of a method of forming an IC chip according to the second manufacturing process m FIGS.

12A-12E, in accordance with some embodiments. It is understood that additional operations may be performed before, during, and/or after the method 1600 depicted in FIG. 16, and that some other processes may only be briefly described herein.

Method 1600 begins with operation 1610, where various transistors of memory device 110 and 120 (FIG. 1) are formed. Operation 1610 includes forming pass gate devices PG1/PG2 for first type memory cells of first memory device 110 (operation 1612) and forming pass gate devices PG1/PG2 for second type memory cells of second memory device 120 (operation 1614). In some embodiments, each pass gate device of the pass gate devices of the first type memory cells has a first driving capability; and each pass gate device of the pass gate devices of the second type memory cells has a second driving capability. In some embodiments, the second driving capability is greater than the first driving capability.

Figure 12:
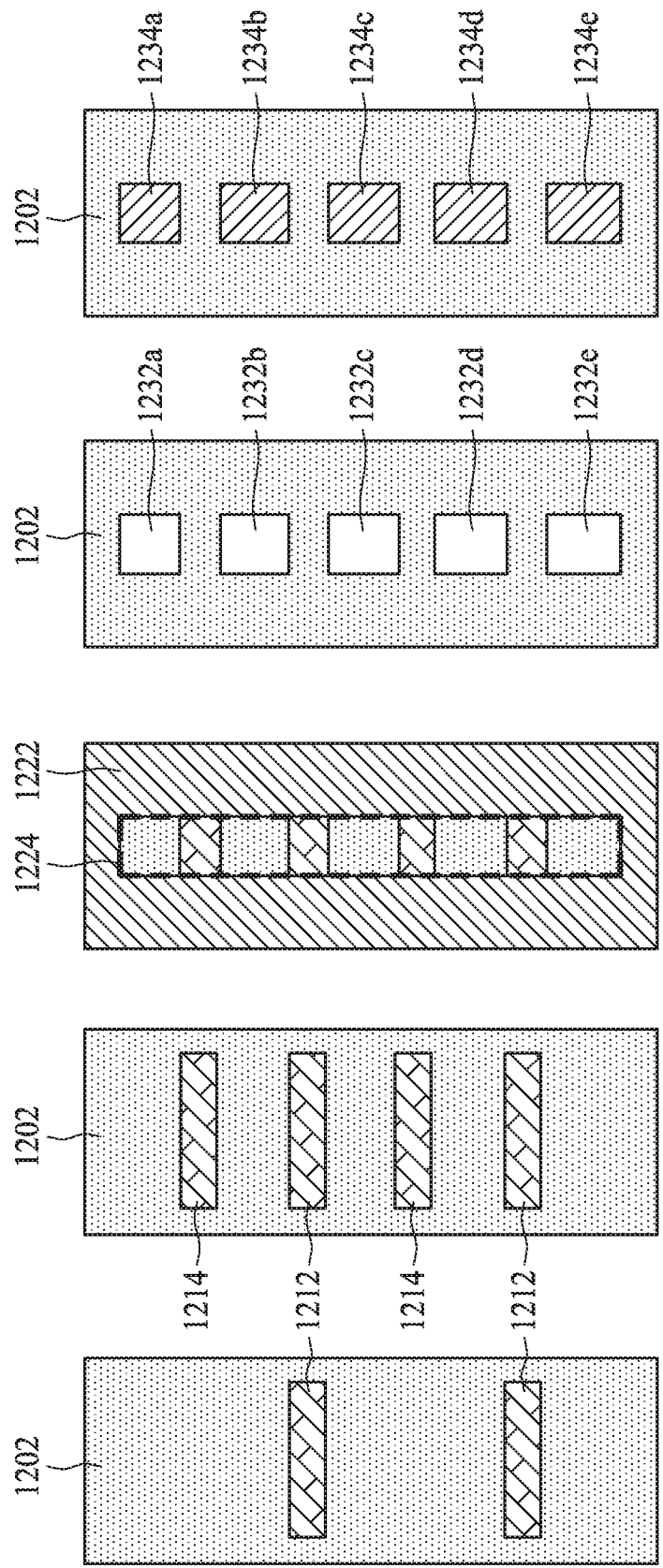
FIGS. 12A-12E are top views of a portion of the first memory device in FIG. 9 at various stages of forming the first metal layer of the chip according to a second manufacturing process, in accordance with some embodiments.

Method 1600 proceeds to operation 1620, where a first lithographic process is performed to form a first set of blocking structures over a dielectric layer, such as forming blocking structures 1212 over a dielectric layer 1202 in FIG. 12, based on the first set of cutting layout patterns, such as cutting layout patterns 1044c and 1044d. Operation 1620 includes forming blocking structures for first type memory cells of first memory device 110 in operation 1622 and forming blocking structures for second type memory cells of second memory device 120 in operation 1624. In some embodiments, operation 1622 is performed based on cutting layout patterns 1044a-1044f in FIG. 10. In some embodiments, operation 1624 is performed based on cutting layout patterns 1452a-1452g in FIG. 14.

Method 1600 proceeds to operation 1630, where a second lithographic process is performed to form a second set of blocking structures over the dielectric layer, such as forming blocking structures 1214 over dielectric layer 1202 in FIG. 12, based on the second set of cutting layout patterns, such as cutting layout patterns 1042d and 1042e. Operation 1630 includes forming additional blocking structures for first type memory cells of first memory device 110 in operation 1632. In some embodiments, operation 1632 is performed based on cutting layout patterns 1042a-1044h in FIG. 10. In some embodiments, operation 1624 is performed as part of operation 1630 and is not part of operation 1620.

Method 1600 proceeds to operation 1640, where a mask layer over the blocking structures is formed. For example, a mask layer 1222 is formed over blocking structures 1212 and 1214 as depicted in FIG. 12C. The mask layer 1222 has an opening 1224 therein, and opening 1224 is formed based on a conductive line layout pattern. For example, operation 1640 includes forming openings based on conductive line layout patterns 1032, 1034, and 1036 in FIG. 10 for first type memory cells of first memory device 110 (operation 1642). Also, operation 1640 includes forming openings based on conductive line layout patterns 1422, 1424, and 1426 in FIG. 14 for second type memory cells of second memory device 120 (operation 1644).

Method 1600 proceeds to operation 1650, where recesses are formed in portions of the dielectric layer that are exposed by the openings of the mask layer and not covered by the blocking structures. For example, recesses 1232a-1232e are formed in portions of the dielectric layer 1202 as depicted in FIG. 12D.

Method 1600 proceeds to operation 1660, where the recesses are filled with a conductive material to form landing pads. For example, landing pads 1234a, 1234b, 1234c, 1234d, and 1234e are formed by filling recesses 1232a-1232e as depicted in FIG. 12E. In some embodiments, the conductive material includes Cu, Ni, TaN, TiN, W, or a combination thereof.

The configurations and operations described above are illustrated as individual examples. In some embodiments, a memory cell or a memory device is implemented by adopting the features of one or more of the individual examples illustrated above.

In accordance with one embodiment, an integrated circuit chip includes a first type memory cell and a second type memory cell. The first type memory cell includes a storage circuit having a first data node, a second data node, a supply voltage node, and a reference voltage node; a first pass gate device having a first terminal, a second terminal, and a control terminal; a first reference line landing pad electrically coupled with the reference voltage node of the first type memory cell; and a first word line landing pad electrically coupled with the control terminal of the first pass gate device of the first type memory cell. The first terminal of the first pass gate device of the first type memory cell is electrically coupled with the first data node of the first type memory cell. The first reference line landing pad of the first type memory cell and the first word line landing pad of the first type memory cell are aligned along a first direction. The second type memory cell includes a storage circuit having a first data node, a second data node, a supply voltage node, and a reference voltage node; a first pass gate device having a first terminal, a second terminal, and a control terminal; a first reference line segment extending along the first direction and electrically coupled with the reference voltage node of the second type memory cell; and a first word line landing pad electrically coupled with the control terminal of the first pass gate device of the second type memory cell. The first terminal of the first pass gate device of the second type memory cell is electrically coupled with the first data node of the second type memory cell. The first word line landing pad of the second type memory cell and the first reference line segment of the second type memory cell are spaced apart along a second direction different from the first direction.

In accordance with another embodiment, an integrated circuit chip includes a first memory device and a second memory device. The first memory device includes a row of first type memory cells, a first reference line, a second reference line, and a first word line. Each memory cell of the row of first type memory cells includes a first reference line landing pad; a second reference line landing pad; a first word line landing pad; and a second word line landing pad. The first reference line landing pad of the memory cell of the row of first type memory cells and the first word line landing pad of the memory cell of the row of first type memory cells are aligned along a first direction. The second reference line landing pad of the memory cell of the row of first type memory cells and the second word line landing pad of the memory cell of the row of first type memory cells are aligned along the first direction. The first reference line extends along a second direction different from the first direction and is electrically coupled with the first reference line landing pad of the memory cell of the row of first type memory cells. The second reference line extends along the second direction and is electrically coupled with the second reference line landing pad of the memory cell of the row of first type memory cells. The first word line extends along the second direction and is electrically coupled with the first word line landing pad of the memory cell of the row of first type memory cells and the second word line landing pad of the memory cell of the row of first type memory cells. The second memory device includes a row of second type memory cells, a first reference line, and a first word line. Each memory cell of the row of second type memory cells includes a first reference line segment, a second reference line segment, a first word line landing pad, and a second word line landing pad. The first reference line segment of the memory cell of the row of second type memory cells and the first word line landing pad of the memory cell of the row of second type memory cells are spaced apart along the second direction. The second reference line segment of the memory cell of the row of second type memory cells and the second word line landing pad of the memory cell of the row of second type memory cells are spaced apart along the second direction. The first reference line extends along the second direction and is electrically coupled with the first reference line segment of the memory cell of the row of second type memory cells and the second reference line segment of the memory cell of the row of second type memory cells. The first word line extends along the second direction and is electrically coupled with the first word line landing pad of the memory cell of the row of second type memory cells and the second word line landing pad of the memory cell of the row of second type memory cells.

In accordance with another embodiment, a method of manufacturing an integrated circuit chip is disclosed. The method includes forming a first memory device having a plurality of first type memory cells and forming a second memory device having a plurality of second type memory cells. Forming the first memory device includes forming a plurality of first reference line landing pads and a plurality of first word line landing pad of the plurality of first type memory cells based on a first conductive line layout pattern, a first set of cutting layout patterns, and a second set of cutting layout patterns. The first conductive line layout pattern extends along a first direction. Each one of the first set of cutting layout patterns and each one of the second set of cutting layout patterns extends along a second direction different from the first direction. The first set of cutting layout patterns and the second set of cutting layout patterns are arranged along the first direction in an alternating manner. Forming the second memory device includes forming a plurality of first word line landing pad of the plurality of second type memory cells based on a second conductive line layout pattern and a third set of cutting layout patterns. The second conductive line layout pattern extends along the first direction, and each one of the third set of cutting layout patterns extends along the second direction.

One general aspect of embodiments described herein includes a method of manufacturing an integrated circuit chip, the method including: forming a first memory device having a plurality of first type memory cells, including: forming a plurality of first reference line landing pads and a plurality of first word line landing pads of the plurality of first type memory cells based on a first conductive line layout pattern, a first set of cutting layout patterns, and a second set of cutting layout patterns, the first conductive line layout pattern extending along a first direction, each one of the first set of cutting layout patterns and each one of the second set of cutting layout patterns extending along a second direction different from the first direction, the first set of cutting layout patterns and the second set of cutting layout patterns being arranged along the first direction in an alternating manner; and forming a second memory device having a plurality of second type memory cells, including: forming a plurality of first word line landing pad of the plurality of second type memory cells based on a second conductive line layout pattern and a third set of cutting layout patterns, the second conductive line layout pattern extending along the first direction, and each one of the third set of cutting layout patterns extending along the second direction.

Another general aspect of embodiments described herein includes a method of forming integrated circuit chip, the method including: forming a first memory device, the first memory device including first memory cells of a first memory layout, the first memory device having first operating characteristics, where the first memory cells have a first width and a first height; and forming a second memory device, the second memory device including second memory cells of a second memory layout, the second memory layout being different than the first memory layout, the second memory device having second operating characteristics, the first operating characteristics being different than the first operating characteristics, where the second memory cells have a second width and a second height and where the first and second height are equal and where a ratio of the second cell width to the first cell width is greater than 1.15.

Yet another general aspect of embodiments described herein includes a method of forming integrated circuit chip, the method including: forming a first memory device including first memory cells, the first memory cells being of a first memory type; forming a second memory device including second memory cells, the second memory cells being a second memory type; forming a first interconnect layer over the first memory device, the first interconnect layer having a first reference line segment, a first word line landing pad, and a first reference line landing pad, the first reference line segment electrically coupled to a first active area, the first word line landing pad electrically coupled to a second active area, the first reference line landing pad electrically coupled to a third active area, the first active area and the second active area on opposing sides of a first gate electrode, the second active area and the third active area on opposing sides of a second gate electrode, the first word line landing pad and the first reference line landing pad being on a same side of the first reference line segment; and forming a second interconnect layer over the second memory device of a second memory cell type, the second interconnect layer having a second reference line segment interposed between a second word line landing pad and a third reference line segment, the second reference line segment electrically coupled to a fourth active area, the second word line landing pad electrically coupled to a fifth active area, the third reference line segment electrically coupled to a sixth active area, the fourth active area and the fifth active area on opposing sides of a third gate electrode, the fifth active area and the sixth active area on opposing sides of a fourth gate electrode, a first length of the first reference line segment and a second length of the second line segment being at least as great as a height or a width of the second memory cell type.

Various types of transistors are discussed in this disclosure as example. In some embodiments, the implementations using other types of transistors different from those illustrated in the present disclosure are within the scope of the subject application.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit chip, the method comprising:
   forming a first memory device having a plurality of first type memory cells, comprising:
      forming a plurality of first reference line landing pads and a plurality of first word line landing pads of the plurality of first type memory cells based on a first conductive line layout pattern, a first set of cutting layout patterns, and a second set of cutting layout patterns, the first conductive line layout pattern extending along a first direction, each one of the first set of cutting layout patterns and each one of the second set of cutting layout patterns extending along a second direction different from the first direction, the first set of cutting layout patterns and the second set of cutting layout patterns being arranged along the first direction in an alternating manner; and
   forming a second memory device having a plurality of second type memory cells, comprising:
      forming a plurality of first word line landing pad of the plurality of second type memory cells based on a second conductive line layout pattern and a third set of cutting layout patterns, the second conductive line layout pattern extending along the first direction, and each one of the third set of cutting layout patterns extending along the second direction.

2. The method of claim 1, wherein forming the plurality of first reference line landing pads and the plurality of first word line landing pad of the plurality of first type memory cells comprises:
   forming a first conductive line based on the first conductive line layout pattern;
   performing a first lithographic process to form a first set of etching windows in a mask layer based on the first set of cutting layout patterns;
   performing a second lithographic process to form a second set of etching windows in the mask layer based on the second set of cutting layout patterns; and
   removing portions of the first conductive line that are exposed by the first set of etching windows in the mask layer and the second set of etching windows in the mask layer.

3. The method of claim 1, wherein forming the plurality of first reference line landing pads and the plurality of first word line landing pad of the plurality of first type memory cells comprises:
   performing a first lithographic process to form a first set of blocking structures over a dielectric layer based on the first set of cutting layout patterns;
   performing a second lithographic process to form a second set of blocking structures over the dielectric layer based on the second set of cutting layout patterns;
   forming a mask layer over the first set of blocking structures and the second set of blocking structures, the mask layer having an opening therein, the opening being formed based on the first conductive line layout pattern;
   forming recesses in portions of the dielectric layer that are exposed by the opening of the mask layer and not covered by the first set of blocking structures and the second set of blocking structures; and
   filling the recesses with a conductive material.

4. The method of claim 3, wherein the conductive material comprises Cu, Ni, TaN, TiN, W, or a combination thereof.

5. The method of claim 1, wherein forming the first memory device further comprises forming a plurality of pass gate devices of the plurality of first type memory cells, each pass gate device of the plurality of pass gate devices of the plurality of first type memory cells has a first driving capability;
   forming the second memory device further comprises forming a plurality of pass gate devices of the plurality of second type memory cells, each pass gate device of the plurality of pass gate devices of the plurality of second type memory cells has a second driving capability; and
   the second driving capability is greater than the first driving capability.

6. The method of claim 5, wherein:
   forming a plurality of pass gate devices of the plurality of first type memory cells further comprises forming the plurality of pass gate devices as finFET devices, wherein each respective finFET device of the plurality of pass gate devices of the plurality of first type memory cells is formed in a first number of fins; and
   forming a plurality of pass gate devices of the plurality of second type memory cells further comprises forming the plurality of pass gate devices as finFET devices, wherein each respective finFET device of the plurality of pass gate devices of the plurality of second type memory cells is formed in a second number of fins, the second number of fins being greater than the first number of fins.

7. The method of claim 6, wherein the first number of fins is one fin.

8. The method of claim 1, wherein the plurality of first reference line landing pads and a plurality of first word line landing pads of the plurality of first type memory cells are formed in a first metallization layer of the first type memory cells.

9. A method of forming integrated circuit chip, the method comprising:
   forming a first memory device, the first memory device comprising first memory cells of a first memory layout, the first memory device having first operating characteristics, wherein the first memory cells have a first width and a first height; and
   forming a second memory device, the second memory device comprising second memory cells of a second memory layout, the second memory layout being different than the first memory layout, the second memory device having second operating characteristics, the second operating characteristics being different than the first operating characteristics, wherein the second memory cells have a second width and a second height and wherein the first and second height are equal and wherein a ratio of the second cell width to the first cell width is greater than 1.15.

10. The method of claim 9, wherein forming a first memory device includes:
    forming a first conductive line based on a conductive line layout pattern;

performing a first lithographic process to form a first set of etching windows in a mask layer based on a first set of cutting layout patterns;
performing a second lithographic process to form a second set of etching windows in the mask layer based on a second set of cutting layout patterns; and
removing portions of the first conductive line that are exposed by the first set of etching windows in the mask layer and the second set of etching windows in the mask layer.

11. The method of claim 10 wherein forming a second memory device includes:
forming a second conductive line based on a second conductive line layout pattern;
performing a third lithographic process to form a third set of etching windows in the mask layer based on a third set of cutting layout patterns; and
removing portions of the second conductive line that are exposed by the third set of etching windows in the mask layer.

12. The method of claim 9, wherein forming a first memory device includes:
performing a first lithographic process to form a first set of blocking structures over a dielectric layer based on a first set of cutting layout patterns;
performing a second lithographic process to form a second set of blocking structures over the dielectric layer based on a second set of cutting layout patterns;
forming a mask layer over the first set of blocking structures and the second set of blocking structures, the mask layer having an opening therein, the opening being formed based on a first conductive line layout pattern;
forming recesses in portions of the dielectric layer that are exposed by the opening of the mask layer and not covered by the first set of blocking structures and the second set of blocking structures; and
filling the recesses with a conductive material.

13. The method of claim 12, wherein forming a second memory device includes:
forming a third set of blocking structures over the dielectric layer based on a second set of cutting layout patterns during the first lithographic process;
forming the mask layer over the third set of blocking structures, the mask layer having a second opening therein, the second opening being formed based on a second conductive line layout pattern;
forming second recesses in portions of the dielectric layer that are exposed by the second opening of the mask layer and not covered by the third set of blocking structures; and
filling the second recesses with the conductive material.

14. A method of forming integrated circuit chip, the method comprising:
forming a first memory device comprising first memory cells, the first memory cells being of a first memory type;
forming a second memory device comprising second memory cells, the second memory cells being a second memory type;
forming a first interconnect layer over the first memory device, the first interconnect layer having a first reference line segment, a first word line landing pad, and a first reference line landing pad, the first reference line segment electrically coupled to a first active area, the first word line landing pad electrically coupled to a second active area, the first reference line landing pad electrically coupled to a third active area, the first active area and the second active area on opposing sides of a first gate electrode, the second active area and the third active area on opposing sides of a second gate electrode, the first word line landing pad and the first reference line landing pad being on a same side of the first reference line segment; and
forming a second interconnect layer over the second memory device of a second memory cell type, the second interconnect layer having a second reference line segment interposed between a second word line landing pad and a third reference line segment, the second reference line segment electrically coupled to a fourth active area, the second word line landing pad electrically coupled to a fifth active area, the third reference line segment electrically coupled to a sixth active area, the fourth active area and the fifth active area on opposing sides of a third gate electrode, the fifth active area and the sixth active area on opposing sides of a fourth gate electrode, a first length of the first reference line segment and a second length of the second line segment being at least as great as a height or a width of the second memory cell type.

15. The method of claim 14, wherein the first word line landing pad, and a first reference line landing pad are formed by:
forming a first conductive line based on a first conductive line layout pattern;
performing a first lithographic process to form a first set of etching windows in a mask layer based on a first set of cutting layout patterns;
performing a second lithographic process to form a second set of etching windows in the mask layer based on a second set of cutting layout patterns; and
removing portions of the first conductive line that are exposed by the first set of etching windows in the mask layer and the second set of etching windows in the mask layer.

16. The method of claim 15 wherein the second word line landing pad and a third reference line segment are formed by:
forming a second conductive line based on a second conductive line layout pattern;
performing the first lithographic process to form a second set of etching windows in the mask layer based on the first set of cutting layout patterns; and
removing portions of the second conductive line that are exposed by the second set of etching windows in the mask layer.

17. The method of claim 14, wherein forming a first memory device comprising first memory cells includes forming first pass gate transistors in the respective memory cells, the first pass gate transistors having a first driving current; and forming a second memory device comprising second memory cells includes forming second pass gate transistors in the respective second memory cells, the second pass gate transistors having a second driving current greater than the first driving current.

18. The method of claim 17, wherein the first pass gate transistors are formed as finFET transistors extending over a first number of fins, the second pass gate transistors are formed as finFET transistors extending over a second number of fins, the second number being greater than the first number.

19. The method of claim 14, wherein respective first memory cells have a first width and a first height, and respective second memory cells have a second width greater than the first width and a second height equal to the first height.

20. The method of claim 14, wherein the first memory cells and the second memory cells are SRAM memory cells.

\* \* \* \* \*